(12) United States Patent
Tsunoda et al.

(10) Patent No.: US 8,306,437 B2
(45) Date of Patent: Nov. 6, 2012

(54) OPTICAL RECEIVER

(75) Inventors: Yukito Tsunoda, Kawasaki (JP); Satoshi Ide, Kawasaki (JP); Shinichi Sakuramoto, Kawasaki (JP); Kazuyuki Mori, Kawasaki (JP); Toru Matsuyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 569 days.

(21) Appl. No.: 12/457,052

(22) Filed: May 29, 2009

(65) Prior Publication Data
US 2009/0238582 A1 Sep. 24, 2009

Related U.S. Application Data

(63) Continuation of application No. PCT/JP2007/052880, filed on Feb. 16, 2007.

(51) Int. Cl.
*H04B 10/06* (2006.01)

(52) U.S. Cl. ........ 398/208; 398/209; 398/210; 398/202; 398/164

(58) Field of Classification Search ............ 398/202, 398/208–210, 164
See application file for complete search history.

(56) References Cited

U.S. PATENT DOCUMENTS

| | | | | |
|---|---|---|---|---|
| 5,917,639 A * | 6/1999 | Ushirozawa | ............ | 398/209 |
| 6,051,963 A * | 4/2000 | Eagar | ............ | 323/282 |
| 6,396,614 B1 * | 5/2002 | Yoshizawa | ............ | 398/202 |
| 6,643,472 B1 * | 11/2003 | Sakamoto et al. | ............ | 398/202 |
| 6,684,032 B1 * | 1/2004 | Umeda | ............ | 398/202 |
| 7,031,621 B2 * | 4/2006 | Nagakubo et al. | ............ | 398/208 |
| 7,041,957 B2 * | 5/2006 | Nakazawa | ............ | 250/214 R |
| 8,190,034 B2 * | 5/2012 | Ichino et al. | ............ | 398/202 |
| 2003/0194244 A1 | 10/2003 | Doh et al. | | |
| 2005/0100349 A1 * | 5/2005 | Kuhara et al. | ............ | 398/202 |

FOREIGN PATENT DOCUMENTS

| | | |
|---|---|---|
| JP | 61-163738 | 7/1986 |
| JP | 63-099634 | 4/1988 |
| JP | 08-139679 | 5/1996 |
| JP | 11-355218 | 12/1999 |
| WO | 00/76093 | 12/2000 |

OTHER PUBLICATIONS

Patent Abstracts of Japan, Publication No. 11-355218, Published Dec. 24, 1999.
Patent Abstracts of Japan, Publication No. 2006-148651, Published Jun. 8, 2006.
Patent Abstracts of Japan, Publication No. 11-298259, Published Oct. 29, 1999.
Patent Abstracts of Japan, Publication No. 05-191355, Published Jul. 30, 1993.

(Continued)

*Primary Examiner* — Kenneth N Vanderpuye
*Assistant Examiner* — Hibret Woldekidan
(74) *Attorney, Agent, or Firm* — Staas & Halsey LLP

(57) ABSTRACT

In an optical receiver, a light receiving element receives the optical packet signals and converts the optical packet signals to electrical signals. A bias voltage supply section supplies bias voltage to the light receiving element. A monitoring section monitors an input level of each optical packet signal or each electrical signal and transmits a monitored value to the bias voltage supply section. In addition, the bias voltage supply section temporarily increases the bias voltage according to magnitude of the monitored value after an end of receiving of each optical packet signal.

2 Claims, 45 Drawing Sheets

OTHER PUBLICATIONS

Patent Abstracts of Japan, Publication No. 2005-039309, Published Feb. 10, 2005.
Patent Abstracts of Japan, Publication No. 09-093204, Published Apr. 4, 1997.
Patent Abstracts of Japan, Publication No. 11-127039, Published May 11, 1999.
Patent Abstracts of Japan, Publication No. 2002-290168, Published Oct. 4, 2002.
Patent Abstracts of Japan, Publication No. 04-265004, Published Sep. 21, 1992.
Patent Abstracts of Japan, Publication No. 2000-261385, Published Sep. 22, 2000.
Patent Abstracts of Japan, Publication No. 2003-318680, Published Nov. 7, 2003.
Patent Abstracts of Japan, Publication No. 61-163738, Published Jul. 24, 1986.
Patent Abstracts of Japan, Publication No. 63-099634, Published Apr. 30, 1988.
Patent Abstracts of Japan, Publication No. 08-139679, Published May 31, 1996.
Japanese Patent Office Action dated Jan. 24, 2012 in Application No. 2008-557963.

* cited by examiner

OPTICAL RECEIVER

This application is a continuing application, filed under 35 U.S.C. §111(a), of International Application PCT/JP2007/052880, filed Feb. 16, 2007.

FIELD

The embodiments discussed herein are related to an optical receiver.

BACKGROUND

With the spread of the Internet, in recent years telecommunication networks have infiltrated into homes and enterprises. In addition, optical access networks for providing services in large quantities at higher speed have developed and passive optical network (PON) systems have widely been adopted as optical access systems.

FIG. 39 illustrates the structure of a PON system. A PON system 6 comprises an optical line terminal (OLT) 6a installed on a station side, optical network units (ONUs) #1 through #n installed on a subscriber side, and a star coupler 6b for optical multiplexing and demultiplexing.

The OLT 6a is connected with the ONUs #1 through #n on a 1-to-n basis by an optical fiber cable F via the star coupler 6b and optical packet communication is performed between the OLT 6a and the ONUs #1 through #n. In FIG. 39, optical packets transmitted in burst mode from the ONUs #1 through #n installed on the subscriber side are multiplexed by the star coupler 6b and are received by the OLT 6a.

FIG. 40 illustrates the level of signals received by the OLT 6a. A horizontal axis indicates time and a vertical axis indicates the level of an electrical signal after an O/E conversion. The ONUs #1 through #n are installed in different subscribers' houses, so the distance between the OLT 6a and each of the ONUs #1 through #n varies. Accordingly, optical packets received by the OLT 6a differ in level. Each time the OLT 6a receives an optical packet transmitted from each ONU, the OLT 6a sets a threshold level for identifying a code.

FIG. 41 illustrates a signal level kept at a constant value by control. A horizontal axis indicates time and a vertical axis indicates a signal level. The optical burst signals which are depicted in FIG. 40 and which differ in signal level are converted by an optical receiving section included in the OLT 6a so that their signal levels will be constant.

FIG. 42 illustrates the rough structure of the optical receiving section. An optical receiving section 50 comprises a photodiode (PD) 51, a preamplifier 52a, a main amplifier 52b, and a step-up circuit 54. The PD 51 O/E-converts the optical burst signals received to electrical signals. The preamplifier 52a amplifies each electrical signal after the O/E conversion. The main amplifier 52b identifies and amplifies the burst signals which differ in input level among different packets, converts the level of the burst signals to a constant level, and outputs the burst signals. The step-up circuit 54 increases voltage inputted from the outside and supplies increased voltage (bias voltage) to the PD 51.

An avalanche photodiode (APD) is used as the PD 51. An APD is a light receiving element. An APD converts light to an electrical signal (photocurrent) when light is directed in a state (reverse bias state) in which bias voltage is applied in the direction (of from a cathode to an anode) in which it is difficult for an electric current to flow. In addition, an APD has the function of multiplying and outputting the electrical signal after the O/E conversion according to the bias voltage. Compared with a conventional pin (p-intrinsic-n) PD, receiving sensitivity can be improved because of this signal multiplication function.

A receiving circuit for widening a dynamic range by changing a multiplication factor according to the level of an input optical signal is proposed as a conventional art using an APD (see, e.g., Japanese Laid-open Patent Publication No. 11-355218 (Paragraphs [0012]-[0018] and FIG. 1)).

Usually an optical signal is inputted to an APD in a state in which certain bias voltage is applied. By doing so, an O/E conversion is made. As a result, if continuous light is received, stable receiving sensitivity is obtained.

An APD to which certain bias voltage is applied has traditionally been used as a light receiving element in the optical receiving section 50 for receiving optical burst signals which differ in input optical level among different packets. However, if the optical receiving section 50 receives a low optical level signal just after receiving a high optical level signal, receiving sensitivity to the low optical level signal becomes lower than ordinary receiving sensitivity.

This problem will now be described in detail. FIG. 43 illustrates the relationship at different received optical levels between bias voltage applied to the APD ($V_{APD}$) and a multiplication factor. A horizontal axis indicates bias voltage (V) applied to the APD and a vertical axis indicates the multiplication factor (also referred to as an M value) of the APD.

As can be seen from graphs depicted in FIG. 43, the multiplication factor falls with an increase in received optical level if the bias voltage is fixed. For example, if the bias voltage is fixed at 57 V, the multiplication factor is about 12.5 at a received optical level of −30 dBm, that is to say, at the time of a low optical level signal being received. However, on the other hand, the multiplication factor is about 3.8 and is low at a received optical level of −6 dBm, that is to say, at the time of a high optical level signal being received. This is a characteristic of the APD. When a high optical level signal is inputted, the multiplication factor is low. When a low optical level signal is inputted, the multiplication factor is high.

FIG. 44 illustrates the waveform of optical burst signals inputted. A horizontal axis indicates time and a vertical axis indicates an optical level. Optical burst signals are inputted to the APD 51 of the optical receiving section 50. It is assumed that a high optical level packet p1 is inputted to the APD 51 and that a low optical level packet p2 is inputted to the APD 51 just after the high optical level packet p1.

FIG. 45 illustrates the relationship between the multiplication factor and the waveform of a response from the APD 51. A waveform H1 indicates the multiplication factor, a horizontal axis indicates time, and a vertical axis indicates the multiplication factor (M value). A waveform H2 indicates the waveform of photocurrent which is outputted from the APD 51 and which is converted to voltage, a horizontal axis indicates time, and a vertical axis indicates a level. In addition, the waveform H2 is the waveform of a response to the above optical packets p1 and p2 obtained at the time of constant bias voltage being applied to the APD 51. The optical packet p1 is converted to a high-level electrical signal p1a and the optical packet p2 is converted to a low-level electrical signal p2a.

It is assumed that the optical burst signals depicted in FIG. 44 are received. When a high optical level signal is received, the multiplication factor of the APD 51 falls. Therefore, when the low-level electrical signal p2a is received just after receiving of the high-level electrical signal p1a, a delay corresponding to an interval T during which the multiplication factor of the APD 51 returns from a low value to a required value (multiplication factor necessary for obtaining normal receiving sensitivity to the low optical level packet p2) occurs as depicted in FIG. 45. As a result, the amplitude of a leading portion of the low-level electrical signal p2a decreases during the interval T (amplitude reduction interval is 500 ns to 1 μs). Receiving sensitivity deteriorates because of this phenomenon.

The cause of this phenomenon will be as follows. While a high optical level signal is being received, a powerful photocurrent flows through the APD 51. Accordingly, the APD 51 generates heat and the multiplication factor falls. After that, the multiplication factor remains low for a short period of time (during the interval T) until the temperature of the APD 51 falls. With conventional optical receivers, as stated above, the multiplication factor of an APD fluctuates according to fluctuations in input optical power for a certain period of time when optical burst signals are received. This leads to distortion of a waveform. As a result, the quality and reliability of receiving fall.

Therefore, if a receiver for receiving optical burst signals is developed, effective measures should be taken to obtain stable receiving sensitivity even in the case of there being a sharp fluctuation in optical power inputted to an APD.

SUMMARY

According to an aspect of the embodiments, an optical receiver for receiving optical packet signals transmitted in burst mode, the optical receiver including: a light receiving element which receives the optical packet signals and converts the optical packet signals to electrical signals; a bias voltage supply section which supplies bias voltage to the light receiving element; and an inductor which temporarily increases the bias voltage, in the case of a low optical level packet signal an input level of which is low being received after receiving of a high optical level packet signal an input level of which is high, after the receiving of the high optical level packet signal by generating induced electromotive force because of a decrease in an amount of electrical signal current.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWING(S)

DESCRIPTION OF EMBODIMENT(S)

Figure 1:
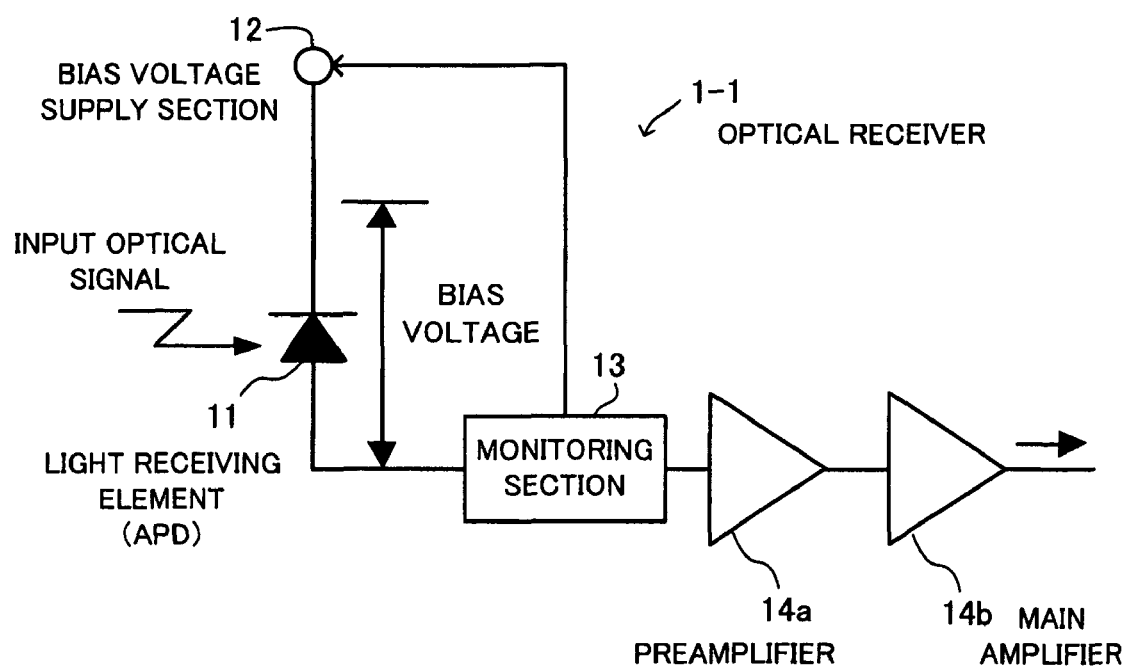
FIG. 1 illustrates the principles underlying an optical receiver.

Embodiments of the present invention will now be described with reference to the accompanying drawings. FIG. 1 illustrates the principles underlying an optical receiver. An optical receiver 1-1 according to a first embodiment comprises a light receiving element 11, a bias voltage supply section 12, a monitoring section 13, a preamplifier 14a, and a main amplifier 14b, and receives optical packets transmitted in burst mode.

Figure 42:
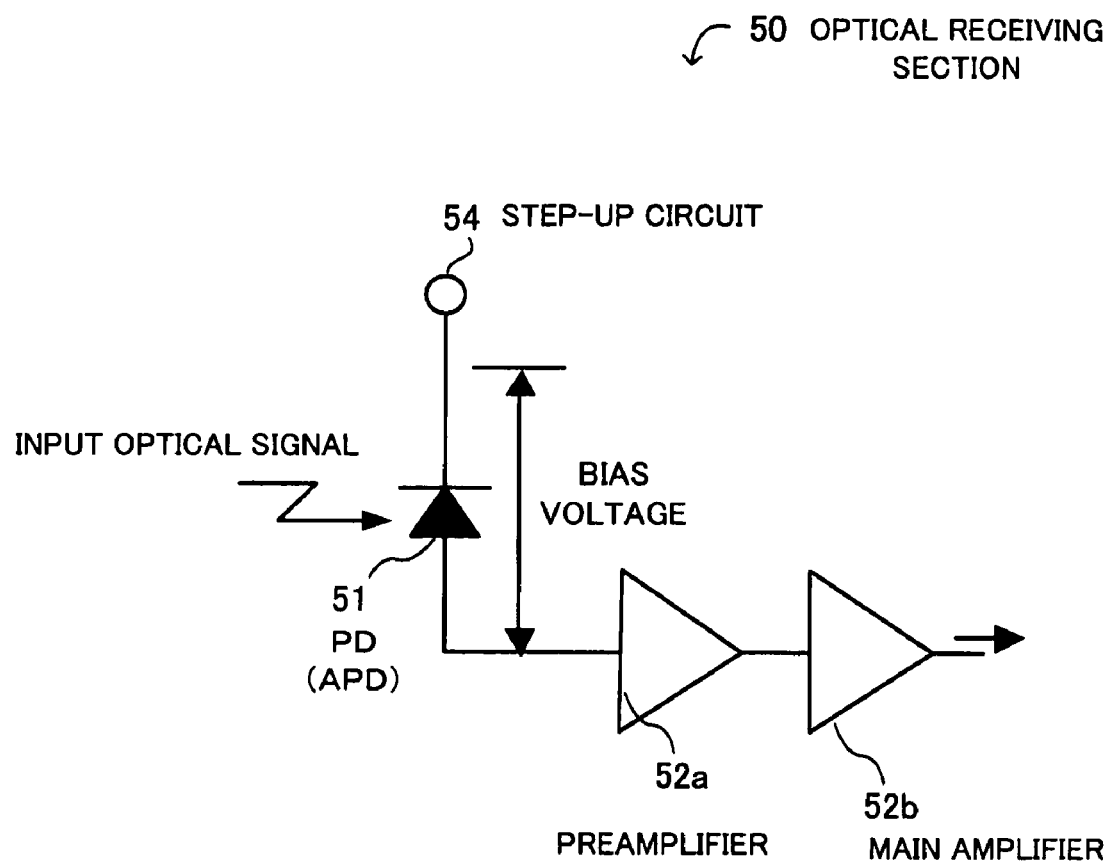
FIG. 42 illustrates the rough structure of an optical receiving section.
Figure 43:
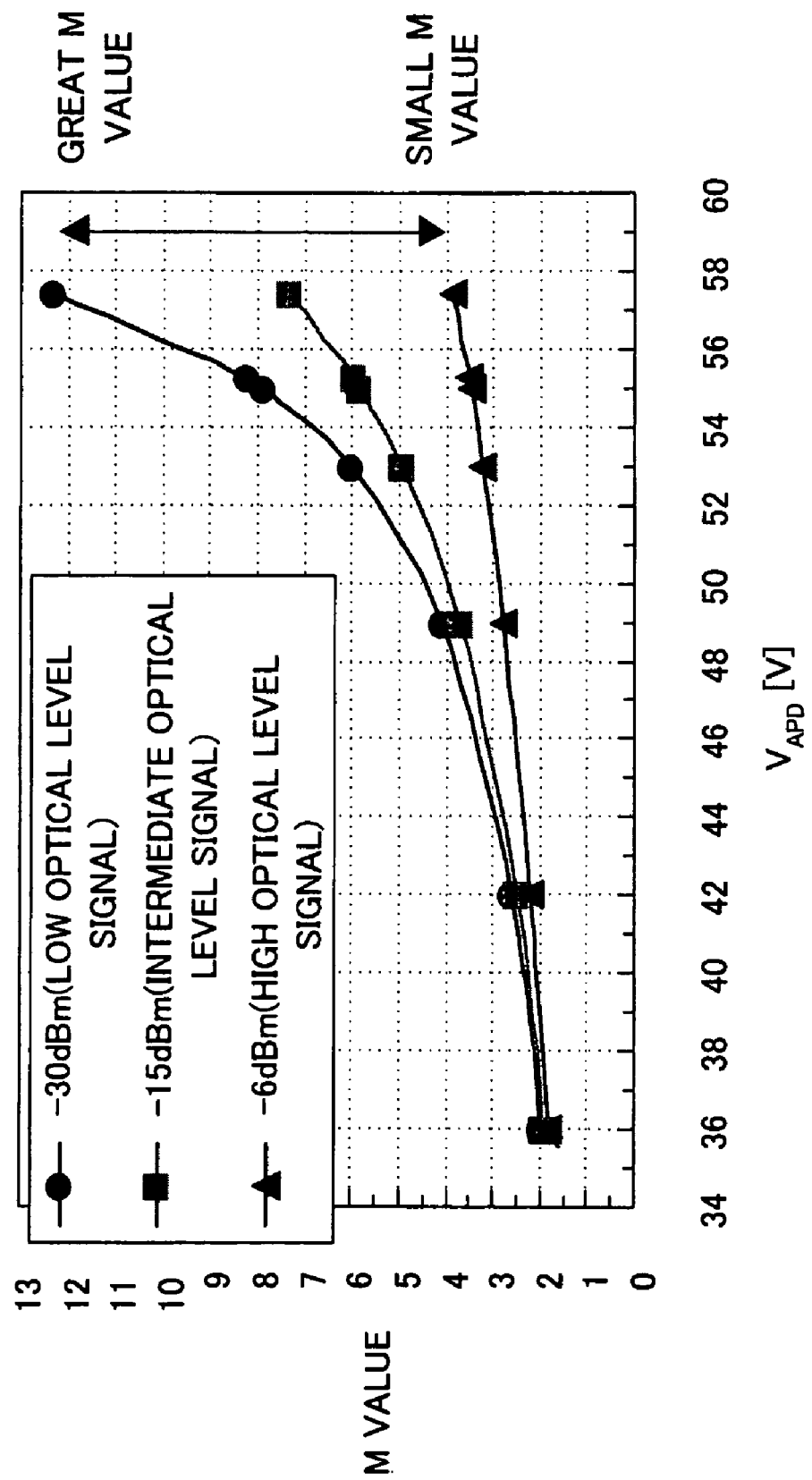
FIG. 43 illustrates the relationship at received optical levels between bias voltage applied to an APD and a multiplication factor.
Figure 44:
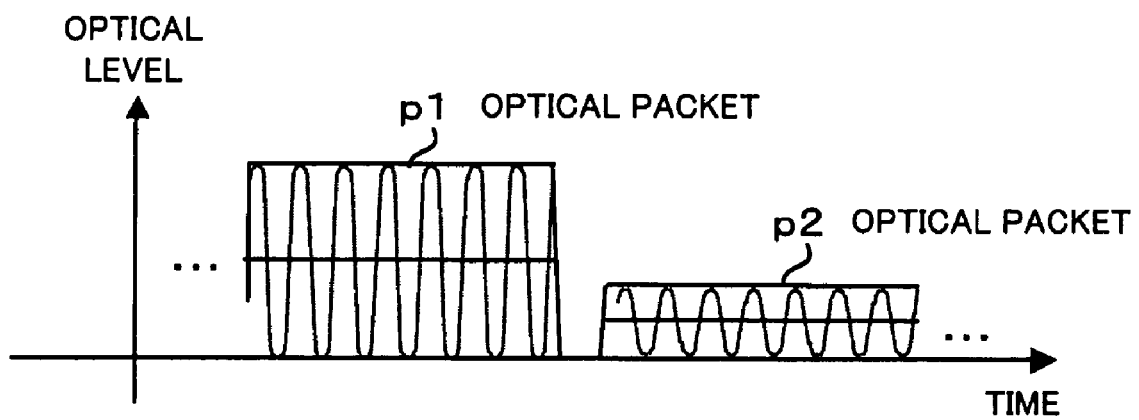
FIG. 44 illustrates the waveform of optical burst signals inputted.

The light receiving element 11 receives an optical packet and converts the optical packet to an electrical signal. An avalanche photodiode is used as the light receiving element 11, so hereinafter a light receiving element will be abbreviated to "APD." The bias voltage supply section 12 (corresponding to the step-up circuit 54 depicted in FIG. 42) supplies bias voltage to the APD 11.

The monitoring section 13 monitors the current level of the electrical signal outputted from the APD 11, and transmits a monitored value to the bias voltage supply section 12. In FIG. 1, the monitoring section 13 is on the anode side of the APD 11 and monitors the current level of the electrical signal outputted from the APD 11. However, the monitoring section 13 may be included in an input interface section to which an optical packet is inputted. In this case, the monitoring section 13 monitors the input optical level of the optical packet.

The preamplifier 14a performs amplification (including an I/V conversion) of the electrical signal (photocurrent) outputted from the APD 11. The main amplifier 14b identifies and amplifies burst signals which differ in input level among different optical packets, converts the burst signals so as to make their levels constant, and outputs the burst signals.

In the optical receiver 1-1 having the above structure, the bias voltage supply section 12 compensates the multiplication factor of the APD 11 by temporarily increasing bias voltage according to the magnitude of the monitored value transmitted from the monitoring section 13 just after an end of receiving of an optical packet.

"Just after the end of the receiving" means a time zone from the time of the end of the receiving of the optical packet to the time of receiving of a next optical packet. When an optical packet the input level of which is high is inputted, the multiplication factor of the APD 11 falls. Accordingly, multiplication factor compensation is begun promptly in this time zone.

Figure 45:
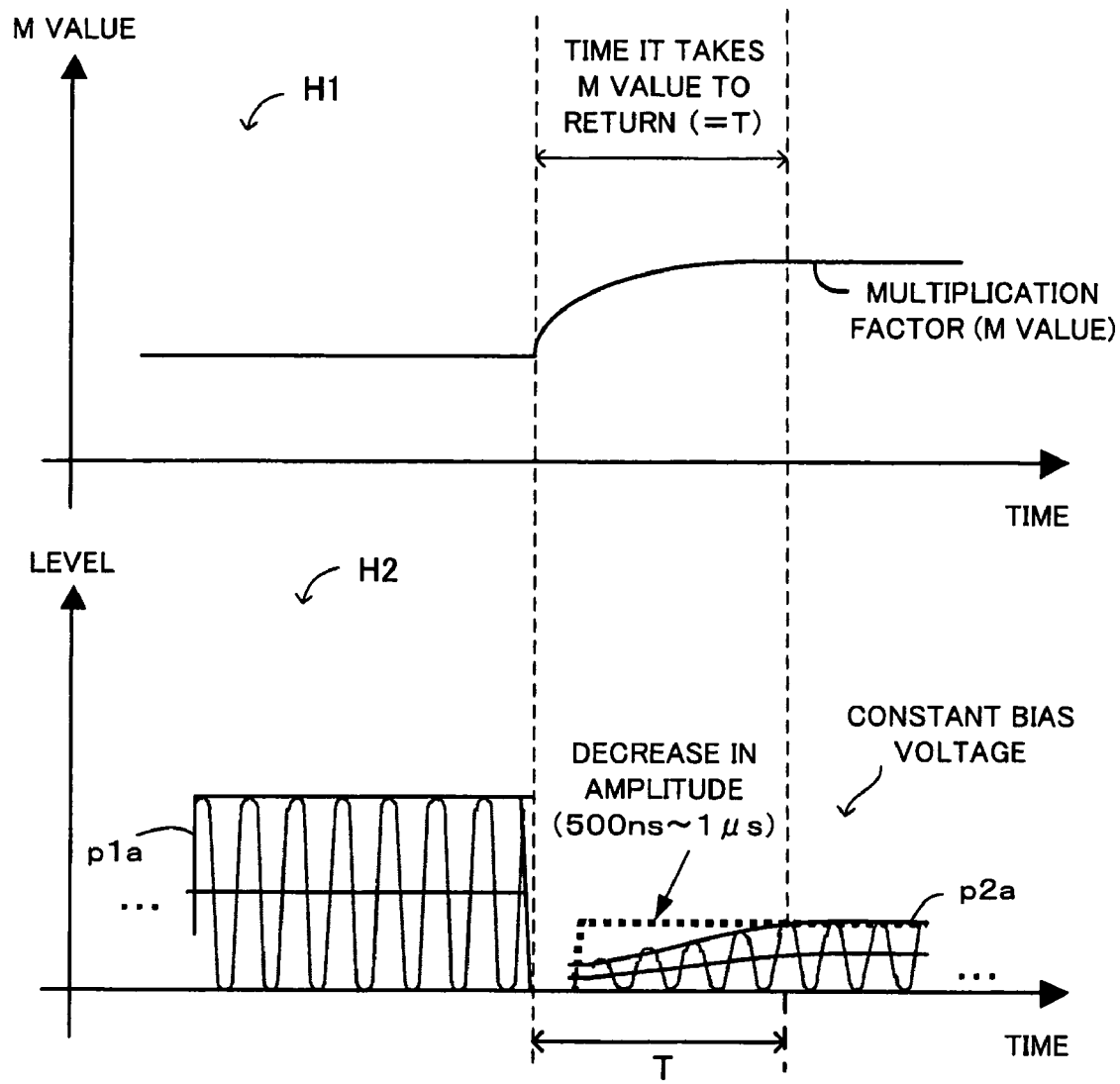
FIG. 45 illustrates the relationship between the multiplication factor and the waveform of a response from the APD.

Multiplication factor compensation according to the present invention will now be described. As described in FIG. 45, when an optical packet the input level of which is high (hereinafter referred to as a high optical level packet) is received, the multiplication factor falls. Therefore, if bias voltage supplied to the APD is fixed and an optical packet the input level of which is low (hereinafter referred to as a low optical level packet) is received just after the receiving of the high optical level packet, the delay corresponding to the interval T during which the multiplication factor of the APD returns from a low value to a value necessary for obtaining normal receiving sensitivity to the low optical level packet occurs. This leads to a deterioration in receiving sensitivity.

Accordingly, in order to improve a deterioration in receiving sensitivity, the bias voltage supply section 12 exercises control. That is to say, just after the end of the receiving of the high optical level packet, the bias voltage supply section 12 temporarily increases bias voltage for the interval T taken to return the multiplication factor. By doing so, the bias voltage supply section 12 compensates for a fall in the multiplication factor.

Figure 2:
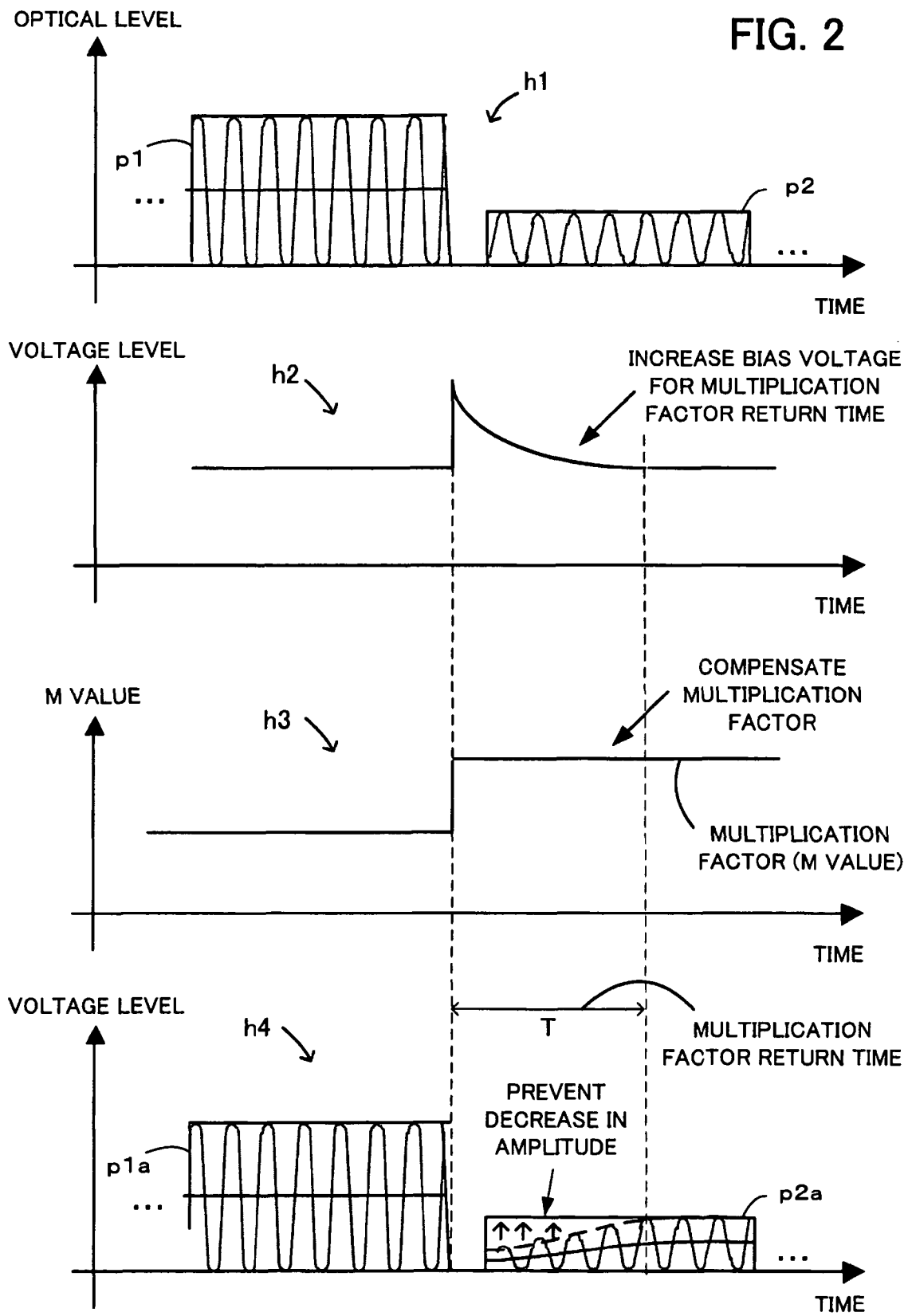
FIG. 2 illustrates how receiving sensitivity is improved by multiplication factor compensation control.

FIG. 2 illustrates how receiving sensitivity is improved by multiplication factor compensation control. A waveform h1 indicates an input optical packet, a horizontal axis indicates time, and a vertical axis indicates an optical level. A waveform h2 indicates bias voltage temporarily increased, a horizontal axis indicates time, and a vertical axis indicates a voltage level.

A waveform h3 indicates a multiplication factor compensated, a horizontal axis indicates time, and a vertical axis indicates a multiplication factor. A waveform h4 indicates the waveform of photocurrent which is outputted from the APD 11 and which is converted to voltage, a horizontal axis indicates time, and a vertical axis indicates a voltage level. In this example, a high optical level packet p1 is O/E-converted to an electrical signal as a high-level packet p1a and a low optical level packet p2 is O/E-converted to an electrical signal as a low-level packet p2a.

The bias voltage supply section 12 increases bias voltage applied to the APD 11 for the multiplication factor return time T just after receiving of the high optical level packet p1. By doing so, the bias voltage supply section 12 compensates for a fall in the multiplication factor which occurs just after the receiving of the high optical level packet p1.

By exercising the above control, the multiplication factor for the entire low optical level packet p2 including a leading portion becomes constant. Therefore, a reduction in amplitude which formerly occurred in a leading portion of the low-level packet p2a can be prevented (amplitude of the low-level packet p2a does not decrease). As a result, even if the low optical level packet p2 is received just after the receiving of the high optical level packet p1, good receiving sensitivity can be maintained.

When the APD 11 receives an optical packet, the APD 11 converts the optical packet to photocurrent. The monitoring section 13 monitors the photocurrent and transmits a monitored value to the bias voltage supply section 12. The bias voltage supply section 12 recognizes from a change in the received monitored value that receiving of the optical packet ends.

That is to say, a monitored value is constant while one optical packet is being received. A change in the monitored value can be considered as the switching of receiving from the optical packet which is currently being received to another optical packet. Accordingly, the bias voltage supply section 12 can determine from a change in the monitored value whether the optical packet has just been received.

Increasing bias voltage according to the magnitude of a monitored value means that the amount of an increase in bias voltage is determined in proportion to the magnitude of a monitored value. For example, the bias voltage supply section 12 stores in advance data (table) by which each monitored value is associated with the amount of an increase in bias voltage corresponding thereto. When the bias voltage supply section 12 receives a monitored value, the bias voltage supply section 12 determines the amount of an increase in bias voltage according to the magnitude of the monitored value on the basis of corresponding data. Then the bias voltage supply section 12 temporarily increases bias voltage by the amount of an increase determined just after the end of the receiving of the optical packet.

If the monitored value is sufficiently small, the level of an optical packet received next in burst mode may be higher than that of the optical packet which is currently being received. Therefore, if the monitored value is smaller than a predetermined value, then control may be exercised so as not to temporarily increase bias voltage.

Figure 3:
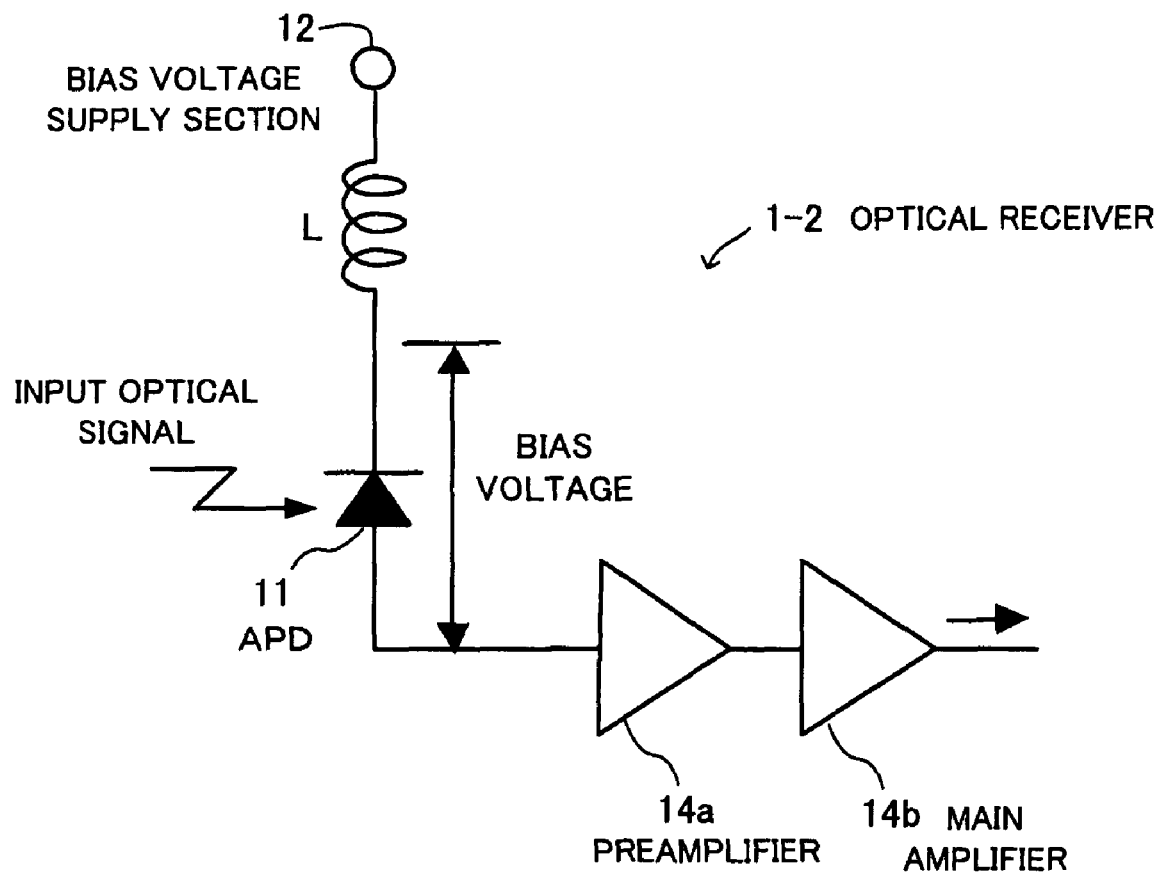
FIG. 3 illustrates the structure of an optical receiver according to a second embodiment.

An optical receiver according to a second embodiment will now be described. FIG. 3 illustrates the structure of an optical receiver according to a second embodiment. An optical receiver 1-2 comprises an APD 11, a bias voltage supply section 12, a preamplifier 14a, a main amplifier 14b, and an inductor L and receives optical packets transmitted in burst mode. Components in FIG. 3 that are the same as those depicted in FIG. 1 are marked with the same symbols and descriptions of them will be omitted.

One end of the inductor L is connected to a bias voltage output side of the bias voltage supply section 12 and another end of the inductor L is connected to a cathode of the APD 11. If a low optical level packet is received after receiving of a high optical level packet, induced electromotive force is generated in the inductor L because of a decrease in the amount of photocurrent which flows through the APD 11. As a result, bias voltage is temporarily increased just after the receiving of the high optical level packet.

Figure 4:
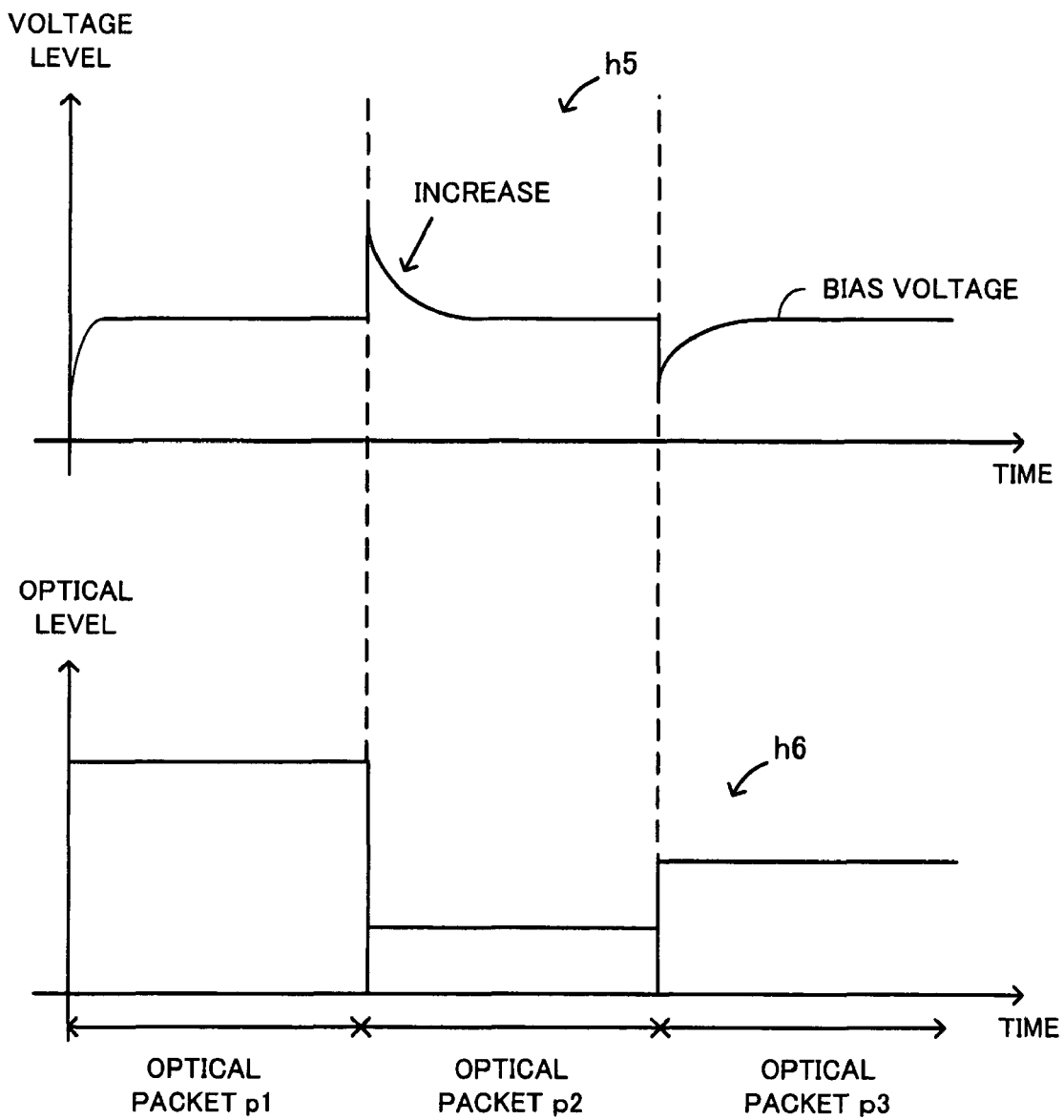
FIG. 4 illustrates how bias voltage is temporarily increased by an inductor.

FIG. 4 illustrates how bias voltage is temporarily increased by the inductor L. A waveform h5 indicates bias voltage temporarily increased, a horizontal axis indicates time, and a vertical axis indicates a voltage level. A waveform h6 indicates input optical packets, a horizontal axis indicates time, and a vertical axis indicates an optical level.

While a high optical level packet p1 is being received, photocurrent which flows through the APD 11 is constant. Accordingly, photocurrent which flows through the inductor L is also constant. As a result, bias voltage is approximately constant. When a low optical level packet p2 is received after the receiving of the high optical level packet p1, photocurrent which flows through the APD 11 decreases. As a result, photocurrent which flows through the inductor L also decreases and induced electromotive force is temporarily generated in the inductor L.

Therefore, bias voltage increased by adding the induced electromotive force is applied for a leading portion of the low optical level packet p2 received just after the receiving of the high optical level packet p1. A fall in the multiplication factor of the APD 11 which occurs just after the receiving of the high optical level packet p1 can be compensated.

When an optical packet p3 the level of which is higher than that of the optical packet p2 is received, photocurrent which flows through the inductor L increases at a boundary between the timing at which the optical packet p2 is received and the timing at which the optical packet p3 is received. Accordingly, induced electromotive force decreases. As a result, bias voltage slightly decreased is applied for a leading portion of the optical packet p3 received just after the receiving of the optical packet p2.

A modification of the optical receiver 1-2 will now be described. A modification of the optical receiver 1-2 includes a time constant control circuit in proximity to an inductor L for adjusting the amount and time (time width which depends on a time constant) of an increase in bias voltage.

Figure 5:
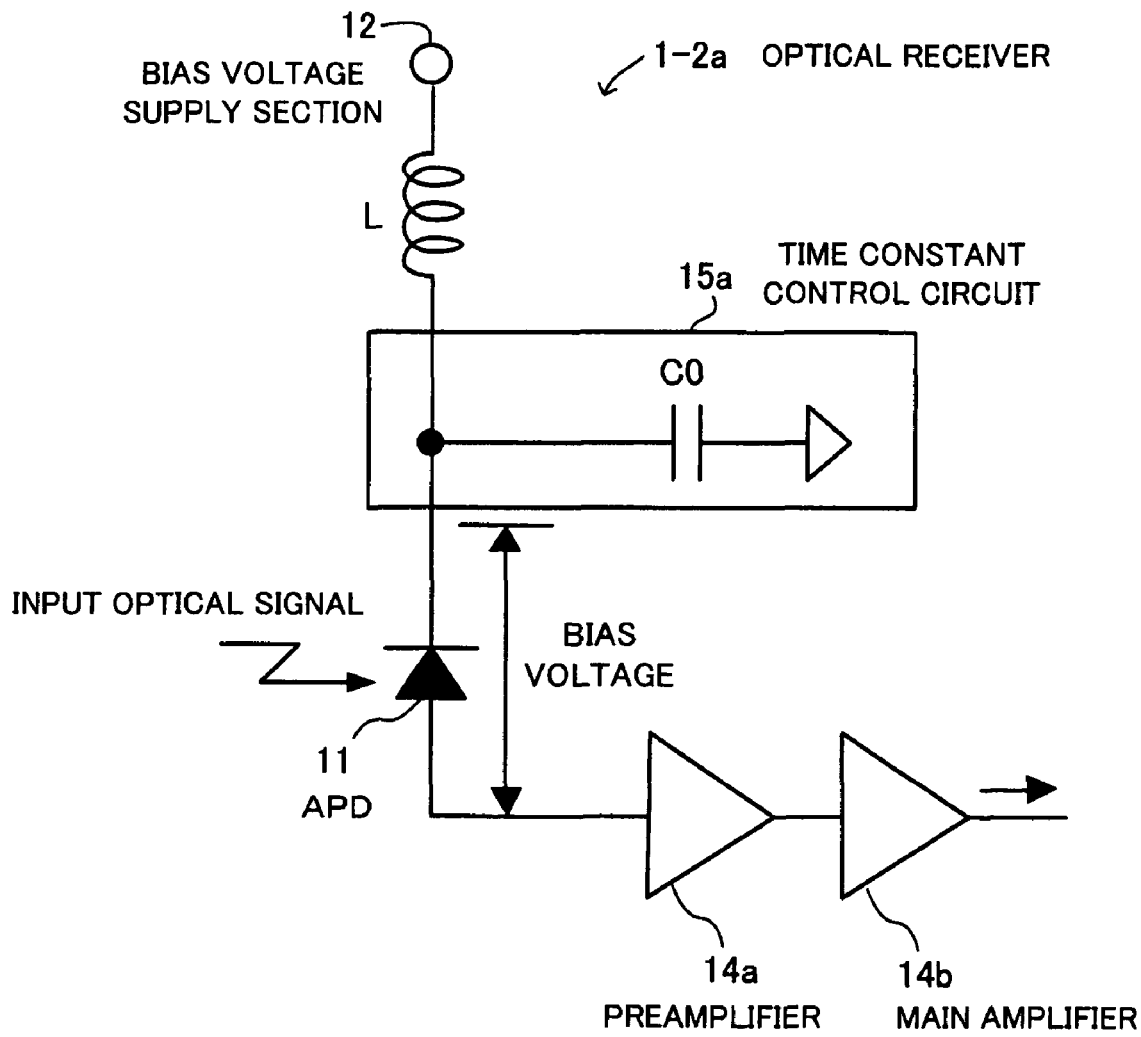
FIG. 5 illustrates a modification of the optical receiver including a time constant control circuit.

FIG. 5 illustrates a modification of the optical receiver including a time constant control circuit. An optical receiver 1-2a includes a time constant control circuit 15a including a condenser C0. One end of the condenser C0 is connected to one end of the inductor L and a cathode of an APD 11. Another end of the condenser C0 is connected to GND.

Figure 6:
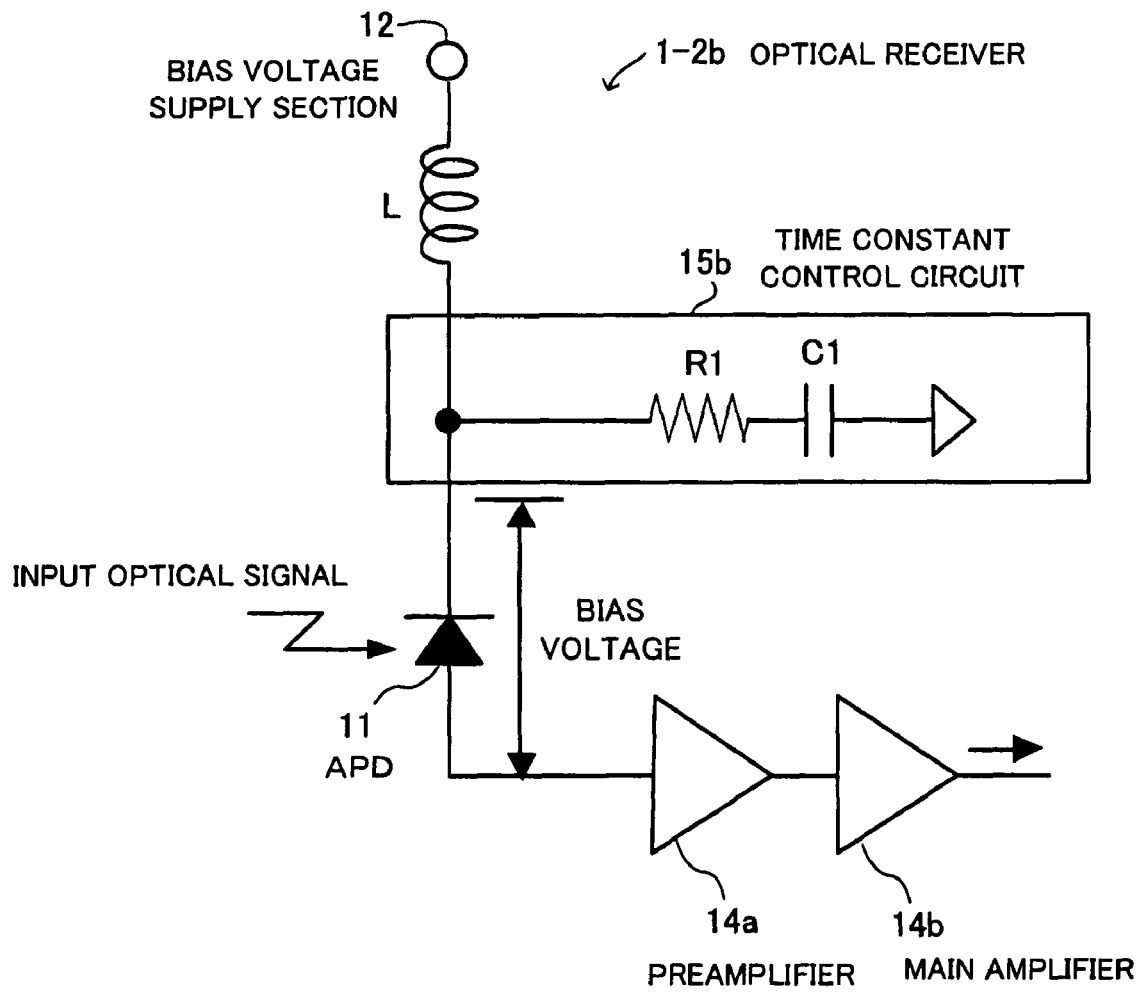
FIG. 6 illustrates a modification of the optical receiver including a time constant control circuit.

FIG. 6 illustrates a modification of the optical receiver including a time constant control circuit. An optical receiver 1-2b includes a time constant control circuit 15b including a resistor R1 and a condenser C1. One end of the resistor R1 is connected to one end of an inductor L and a cathode of an APD 11. Another end of the resistor R1 is connected to one end of the condenser C1. Another end of the condenser C1 is connected to GND.

Figure 7:
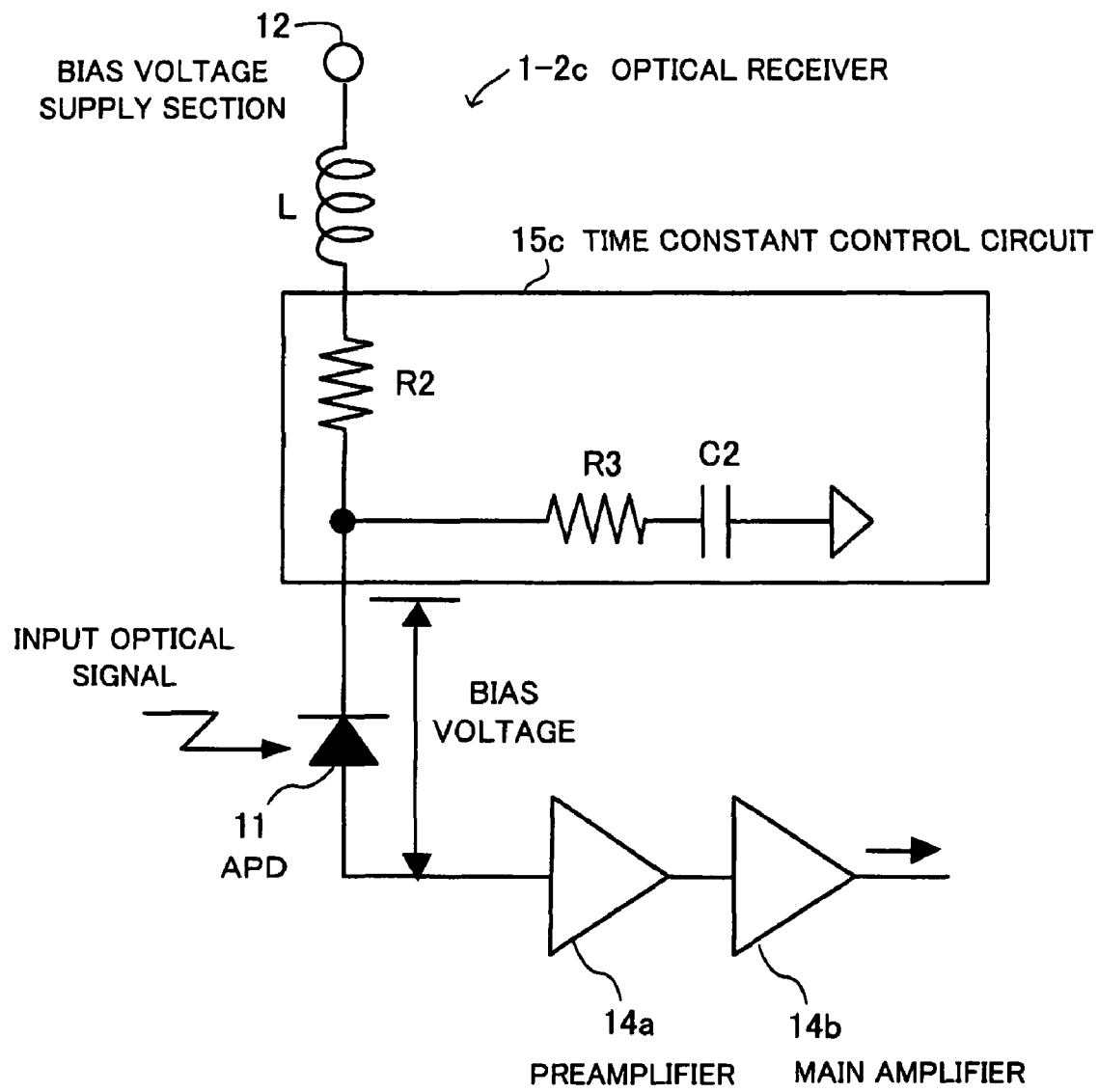
FIG. 7 illustrates a modification of the optical receiver including a time constant control circuit.

FIG. 7 illustrates a modification of the optical receiver including a time constant control circuit. An optical receiver 1-2c includes a time constant control circuit 15c including resistors R2 and R3 and a condenser C2. One end of the resistor R2 is connected to one end of an inductor L. Another end of the resistor R2 is connected to one end of the resistor R3 and a cathode of an APD 11. Another end of the resistor R3 is connected to one end of the condenser C2. Another end of the condenser C2 is connected to GND.

One of the above time constant control circuits 15a, 15b, and 15c depicted in FIGS. 5, 6, and 7, respectively, is used, the value of an inductor, a resistor, or a condenser is adjusted, and the waveform of bias voltage to which induced electromotive force is added is changed in the direction of amplitude or time. By doing so, a desired increase in bias voltage can be realized for multiplication factor return time.

Figure 8:
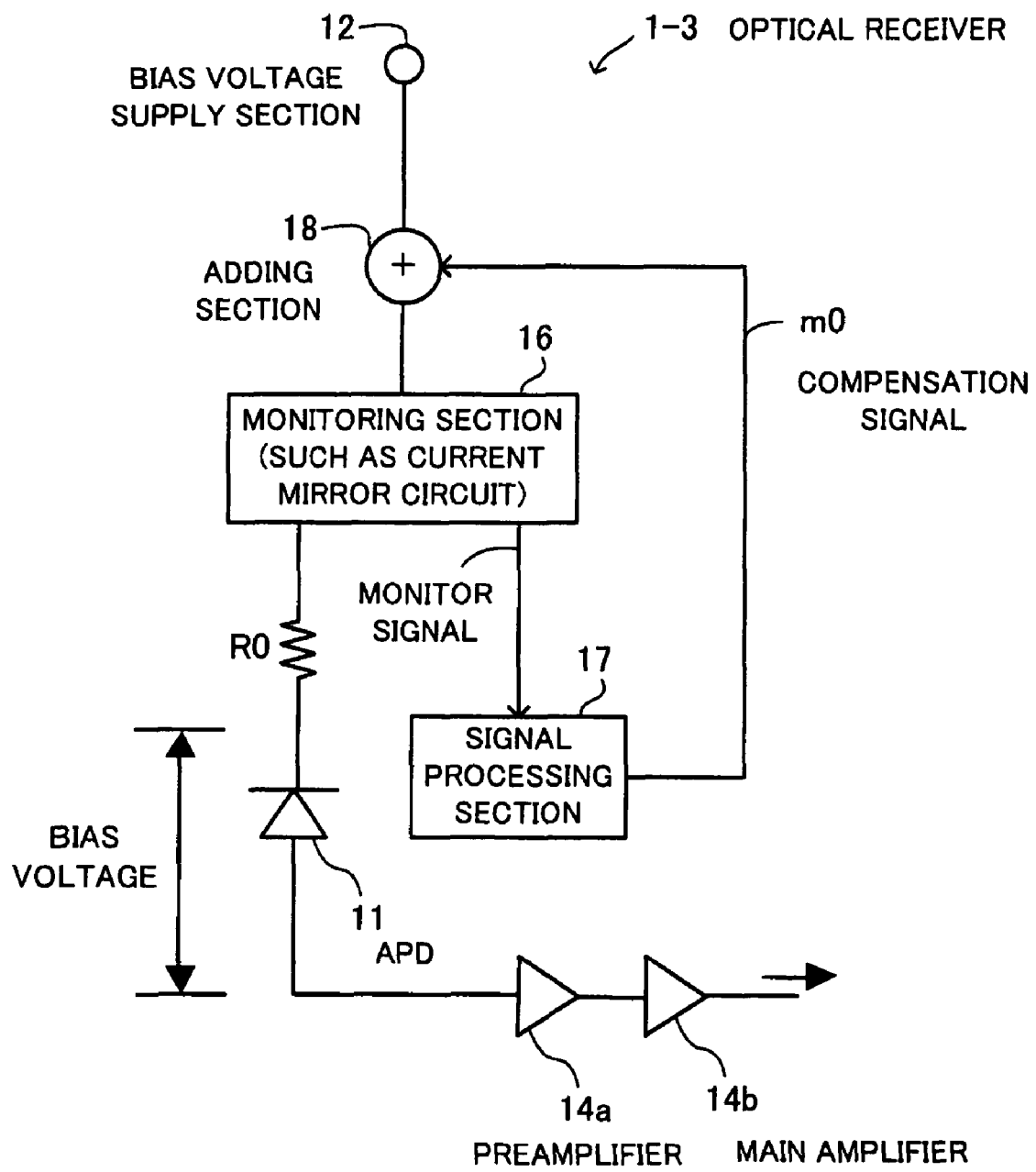
FIG. 8 illustrates the structure of an optical receiver according to a third embodiment.

An optical receiver according to a third embodiment will now be described. FIG. 8 illustrates the structure of an optical receiver according to a third embodiment. An optical receiver 1-3 comprises an APD 11, a bias voltage supply section 12, a preamplifier 14a, a main amplifier 14b, a monitoring section 16, a signal processing section 17, and an adding section 18 and receives optical packets transmitted in burst mode. The monitoring section 16 and a cathode of the APD 11 are connected via a resistor R0. Components which have already been described are marked with the same symbols and descriptions of them will be omitted.

The monitoring section 16 monitors an electrical signal and outputs a monitor signal. To be concrete, if a current mirror circuit is used as the monitoring section 16, the monitoring section 16 makes a copy of photocurrent outputted from the APD 11, and outputs the copy as a monitor signal.

The signal processing section 17 processes the monitor signal and generates a compensation signal m0 which is used for temporarily increasing bias voltage just after an end of receiving of an optical packet. The adding section 18 adds the compensation signal m0 to bias voltage applied to the APD 11 and supplies a signal obtained to the APD 11. In addition, the signal processing section 17 generates the compensation signal m0 for multiplication factor return time for increasing bias voltage. By doing so, the signal processing section 17 compensates for a fall in the multiplication factor of the APD 11 for a low optical level packet.

The difference in characteristic between the optical receiver 1-2 according to the second embodiment depicted in FIG. 3 and the optical receiver 1-3 according to the third embodiment will now be described. Hereinafter bias voltage supplied to the APD 11 after multiplication factor compensation is also referred to as a bias voltage increase signal.

With the optical receiver 1-2 according to the second embodiment depicted in FIG. 3, induced electromotive force generated in the inductor L is used for exercising control for temporarily increasing bias voltage. In this case, control for increasing bias voltage is exercised by the use of induced electromotive force generated in the inductor L according to the amount of a change in photocurrent which flows through the APD 11. However, the electric power of a bias voltage increase signal is limited. (Photocurrent is an input signal itself, so the photocurrent cannot be increased. As a result, the electric power of the bias voltage increase signal generated by the use of the photocurrent directly related to control exercised for increasing bias voltage is limited.)

Figure 9:
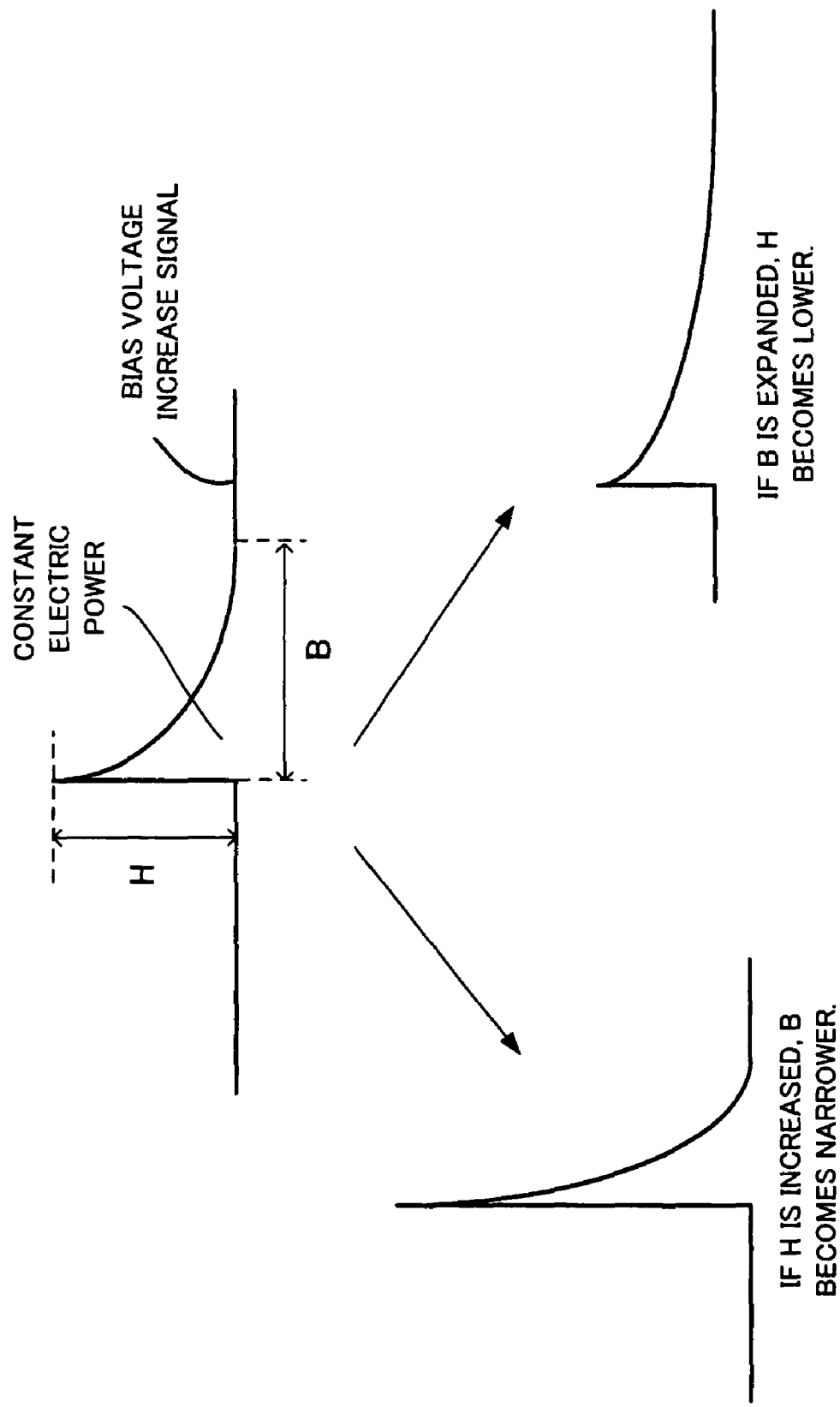
FIG. 9 illustrates the waveform of a bias voltage increase signal.

FIG. 9 illustrates the waveform of the bias voltage increase signal. FIG. 9 illustrates the waveform of the bias voltage increase signal generated by the optical receiver 1-2 according to the second embodiment. With the optical receiver 1-2 the electric power of the bias voltage increase signal is constant and limited. If height H which indicates the amount of an increase of the bias voltage increase signal (and which indicates the amount of a sharp signal increase at the head of a low optical level packet) is increased, then time width B which depends on a time constant becomes narrower and the waveform of a portion which sharply increases becomes narrower. Conversely, if the time width B which depends on the time constant is expanded by time (multiplication factor return time, for example) for which an increase in bias voltage is maintained, then the height H decreases. That is to say, the time width B which depends on the time constant and the height H conflict with each other.

With the optical receiver 1-2 according to the second embodiment, photocurrent itself which flows through the APD 11 and which is directly related to control exercised for increasing bias voltage is used for exercising control for temporarily increasing bias voltage. With the optical receiver 1-3 according to the third embodiment, however, a copy of photocurrent outputted from the APD 11 is made. Photocurrent which flows through the APD 11 flows along one route and photocurrent used for exercising control for temporarily increasing bias voltage flows along another route. The copy (monitor signal) which flows along another route is used for exercising control for temporarily increasing bias voltage. By doing so, height H and time width B (which depends on a time constant) of the bias voltage increase signal can be adjusted arbitrarily. That is to say, the height H and time width B of the bias voltage increase signal can be adjusted more flexibly.

Figure 10:
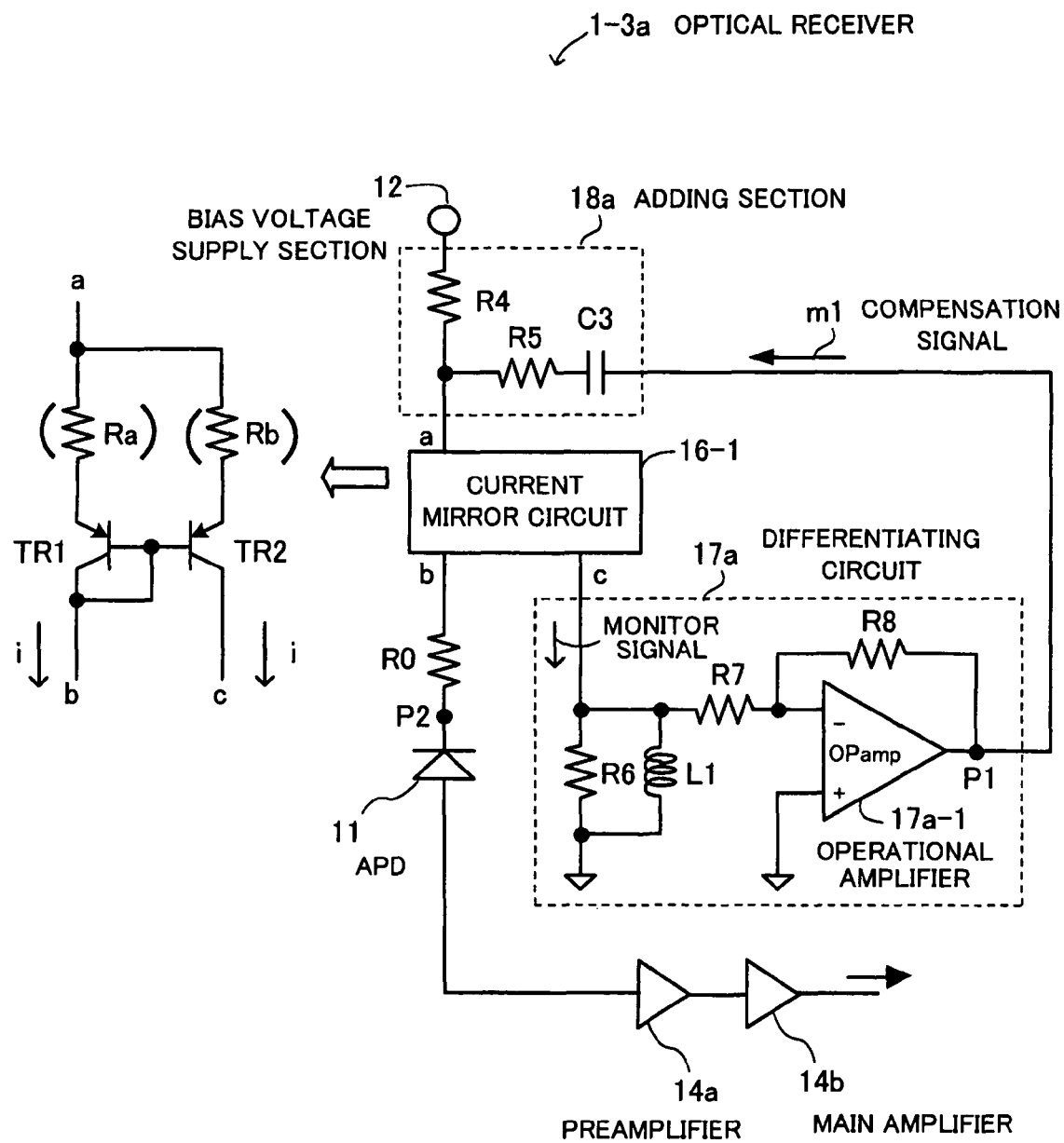
FIG. 10 illustrates a first example of the structure of the optical receiver.

A concrete example of the structure of the optical receiver 1-3 will now be described. FIG. 10 illustrates a first example of the structure of the optical receiver 1-3. An optical receiver 1-3a comprises an APD 11, a bias voltage supply section 12, a preamplifier 14a, a main amplifier 14b, a current mirror circuit 16-1, a differentiating circuit 17a, and an adding section 18a.

The adding section 18a includes resistors R4 and R5 and a condenser C3. One end of the resistor R4 is connected to an output side of the bias voltage supply section 12 and another end of the resistor R4 is connected to one end of the resistor R5 and an input side a of the current mirror circuit 16-1. Another end of the resistor R5 is connected to one end of the condenser C3 and another end of the condenser C3 is connected to an output side of the differentiating circuit 17a.

The differentiating circuit 17a corresponding to the signal processing section 17 depicted in FIG. 8 includes resistors R6, R7, and R8, an inductor L1, and an operational amplifier 17a-1. One end of the resistor R6 is connected to an output side c of the current mirror circuit 16-1, one end of the inductor L1, and one end of the resistor R7. Another end of the resistor R6 is connected to another end of the inductor L1 and GND.

Another end of the resistor R7 is connected to one end of the resistor R8 and an input side (−) of the operational amplifier 17a-1. Another end of the resistor R8 is connected to an output side of the operational amplifier 17a-1 and another end of the condenser C3. An input side (+) of the operational amplifier 17a-1 is connected to GND.

If pnp bipolar transistors, for example, are used, the current mirror circuit 16-1 has a structure depicted in FIG. 10. The current mirror circuit 16-1 includes resistors Ra and Rb and transistors TR1 and TR2.

The input side a of the current mirror circuit 16-1 is connected to one end of the resistor Ra and one end of the resistor Rb. Another end of the resistor Ra is connected to an emitter of the transistor TR1. Another end of the resistor Rb is connected to an emitter of the transistor TR2. An output side b of the current mirror circuit 16-1 is connected to a collector and a base of the transistor TR1 and a base of the transistor TR2. The output side c of the current mirror circuit 16-1 is connected to a collector of the transistor TR2 (current mirror circuit 16-1 needs not to include the resistors Ra and Rb). By using the circuit having the above structure, a copy of current i (photocurrent which flows through the APD 11) outputted from the output side b of the current mirror circuit 16-1 is made and the same current i (monitor signal) is outputted from the output side c of the current mirror circuit 16-1.

The monitor signal inputted to the differentiating circuit 17a is differentiated by LR of the inductor L1 and the resistor R6 (differentiated mainly by the component of L) and a differential waveform is generated (that is to say, a signal the waveform of which is sharp at the head of an input optical packet is generated).

The value of the resistor R6 is a primary parameter which has an influence on a change in time constant. Time width B which depends on a time constant can be adjusted mainly by the value of the resistor R6. In addition, a differential signal the time width B of which is adjusted can be amplified (inverted and amplified) by the operational amplifier 17a-1, so height H can be adjusted.

A signal (compensation signal m1) outputted from the operational amplifier 17a-1 is transmitted to the adding section 18a, is added to original bias voltage applied to the APD 11, and is supplied to the APD 11 as a bias voltage increase signal.

When the monitor signal is differentiated by the differentiating circuit 17a, high-frequency components are outputted. Therefore, the adding section 18a includes the condenser C3 and adds the compensation signal m1 to the original bias voltage by AC coupling (if a level loss is allowable to a certain extent, then the adding section 18a need not include the condenser C3).

Figure 11:
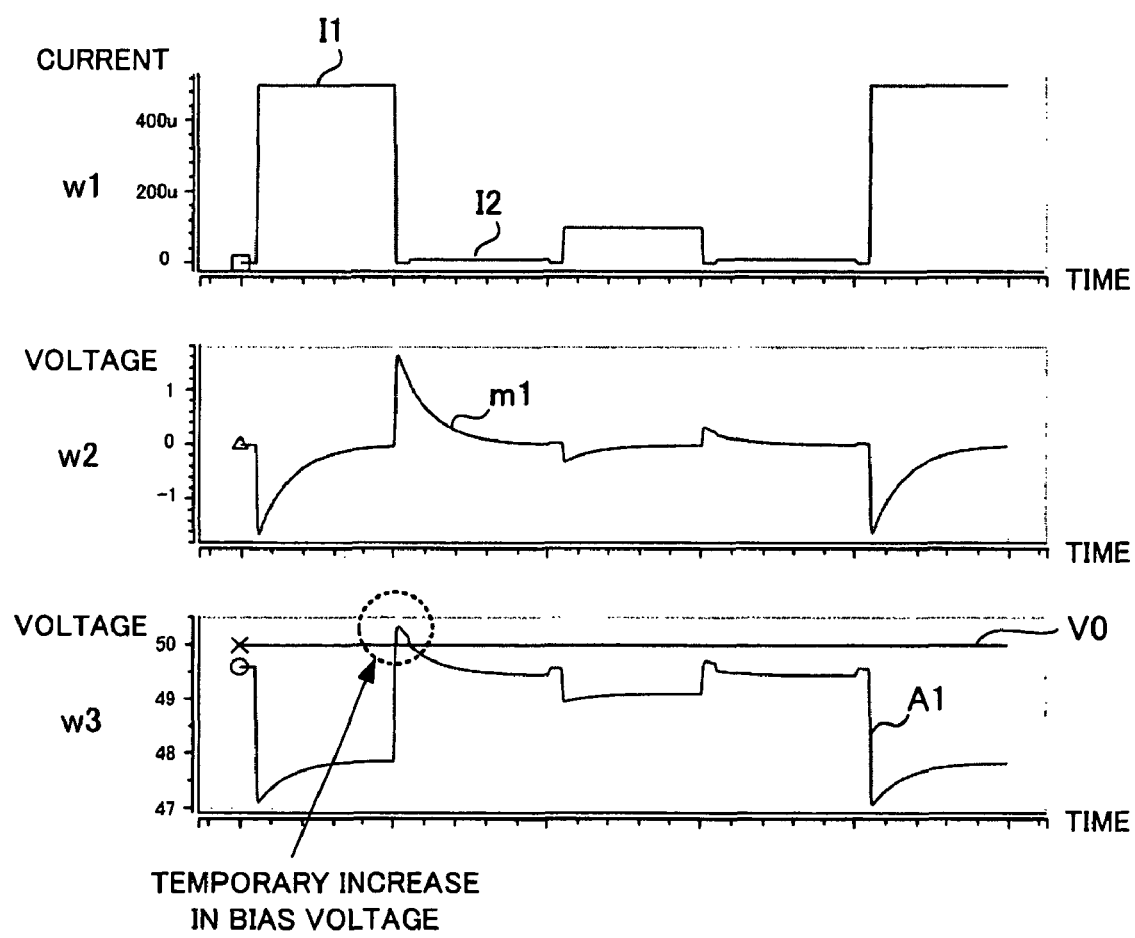
FIG. 11 illustrates each waveform in the optical receiver.

FIG. 11 illustrates each waveform in the optical receiver 1-3a. A waveform w1 indicates current which passes through a resistor R0, a horizontal axis indicates time, and a vertical axis indicates current. A waveform w2 indicates the compensation signal m1 which is outputted from the differentiating circuit 17a and which is measured at a position P1 (depicted in FIG. 10), a horizontal axis indicates time, and a vertical axis indicates voltage. A waveform w3 indicates a bias voltage increase signal A1 after multiplication factor compensation which is measured at a position P2 (depicted in FIG. 10), and original bias voltage V0 supplied from the bias voltage supply section 12, a horizontal axis indicates time, and a vertical axis indicates voltage.

A strong current I1 (corresponding to a high optical level packet) changes to a weak current I2 (corresponding to a low optical level packet) on the waveform w1 at a point of time. At this point of time the compensation signal m1 having a differential waveform is generated on the waveform w2. The waveform w3 indicates the bias voltage increase signal A1 generated by adding (superimposing) the compensation signal m1 to the bias voltage V0. As can be seen from the waveform 3, bias voltage temporarily increases at the above point of time.

As can be seen from the waveform 3, a direct-current drop occurred in the bias voltage increase signal A1. This direct-current drop depends greatly on the structure of an apparatus used in a simulation. That is to say, this direct-current drop occurred because of the impedance of a bias system (bias voltage supply section 12) used at the time of the simulation being done or the impedance of the current mirror circuit 16-1.

As has been described, with the optical receiver 1-3a the current mirror circuit 16-1 makes a copy of photocurrent. The differentiating circuit 17a differentiates the monitor signal which is the copy, and controls the time constant of the differential waveform. By doing so, the differentiating circuit 17a sets bias voltage increase time to predetermined multiplication factor return time. After setting the time constant, the differentiating circuit 17a amplifies the differential waveform to a predetermined level, sets the amount of an increase in bias voltage, and generates the compensation signal m1. The adding section 18a adds the compensation signal m1 to the bias voltage, generates the bias voltage increase signal for multiplication factor compensation, and supplies the bias voltage increase signal to the APD 11.

As a result, multiplication factor return time (time width B which depends on a time constant) and the amount of an increase (height H) of the bias voltage increase signal can be adjusted arbitrarily. That is to say, the time width B and height H of the bias voltage increase signal can be adjusted more flexibly. Therefore, a deterioration in receiving sensitivity can flexibly be improved with greater accuracy.

Figure 12:
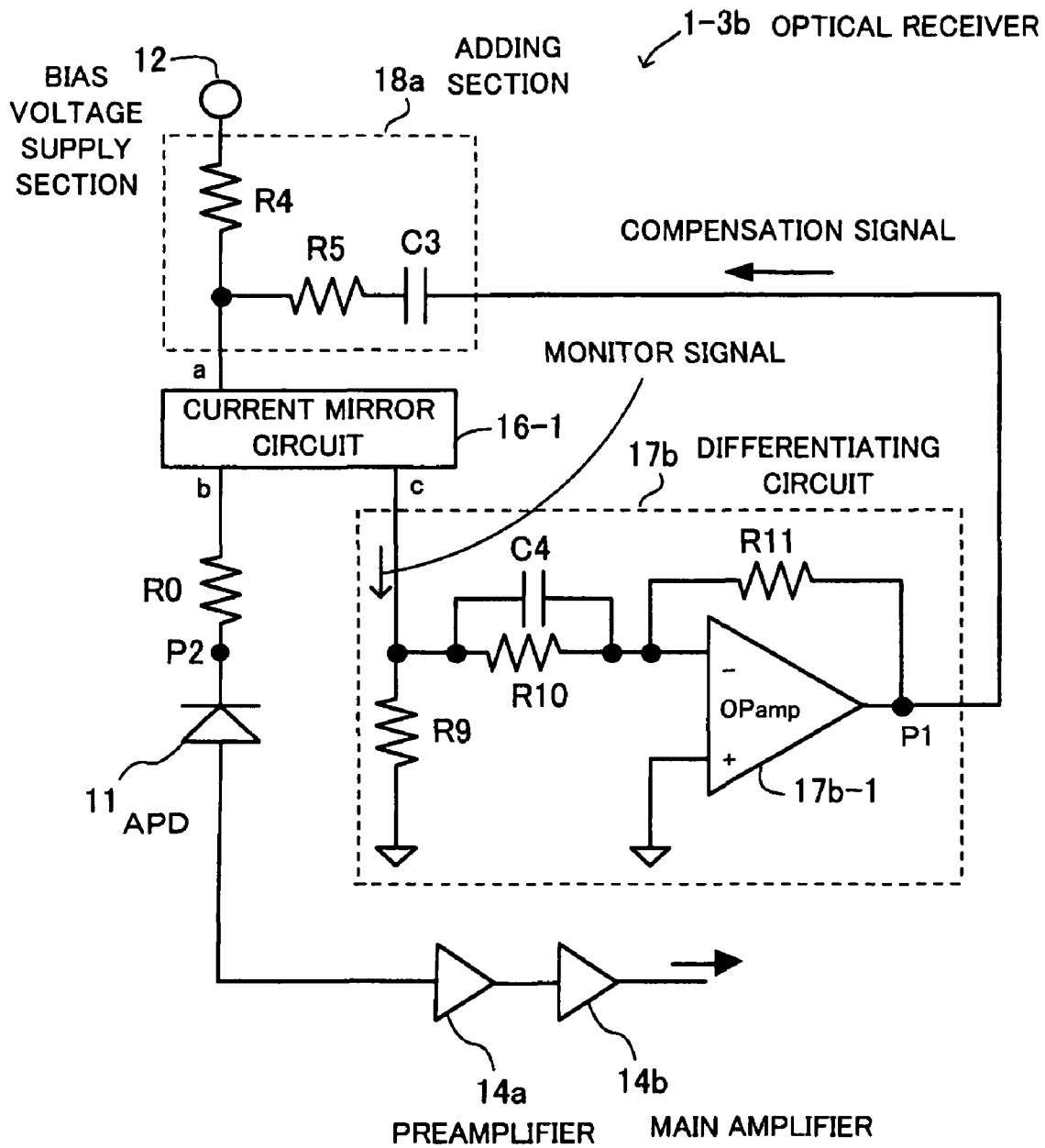
FIG. 12 illustrates a second example of the structure of the optical receiver.

A second example of the structure of the optical receiver 1-3 will now be described. FIG. 12 illustrates a second example of the structure of the optical receiver 1-3. An optical receiver 1-3b comprises an APD 11, a bias voltage supply section 12, a preamplifier 14a, a main amplifier 14b, a current mirror circuit 16-1, a differentiating circuit 17b, and an adding section 18a. The differentiating circuit 17b corresponding to the signal processing section 17 depicted in FIG. 8 includes resistors R9, R10, and R11, a condenser C4, and an operational amplifier 17b-1. One end of the resistor R9 is connected to an output side c of the current mirror circuit 16-1, one end of the condenser C4, and one end of the resistor R10. Another end of the resistor R9 is connected to GND. Another end of the condenser C4 is connected to another end of the resistor R10, one end of the resistor R11, and an input side (−) of the operational amplifier 17b-1. Another end of the resistor R11 is connected to an output side of the operational amplifier 17b-1 and one end of a condenser C3. An input side (+) of the operational amplifier 17b-1 is connected to GND.

The differentiating circuit 17a included in the optical receiver 1-3a performs differentiation by LR. However, the differentiating circuit 17b included in the optical receiver 1-3b performs differentiation by CR (by the condenser C4 and the resistor R10). Waveforms (which indicate current that passes through a resistor R0, a compensation signal, and a bias voltage increase signal) in the optical receiver 1-3b which is taken as the second example of the structure of the optical receiver 1-3 have the same shapes as those of the waveforms depicted in FIG. 11, so descriptions of them will be omitted.

Figure 13:
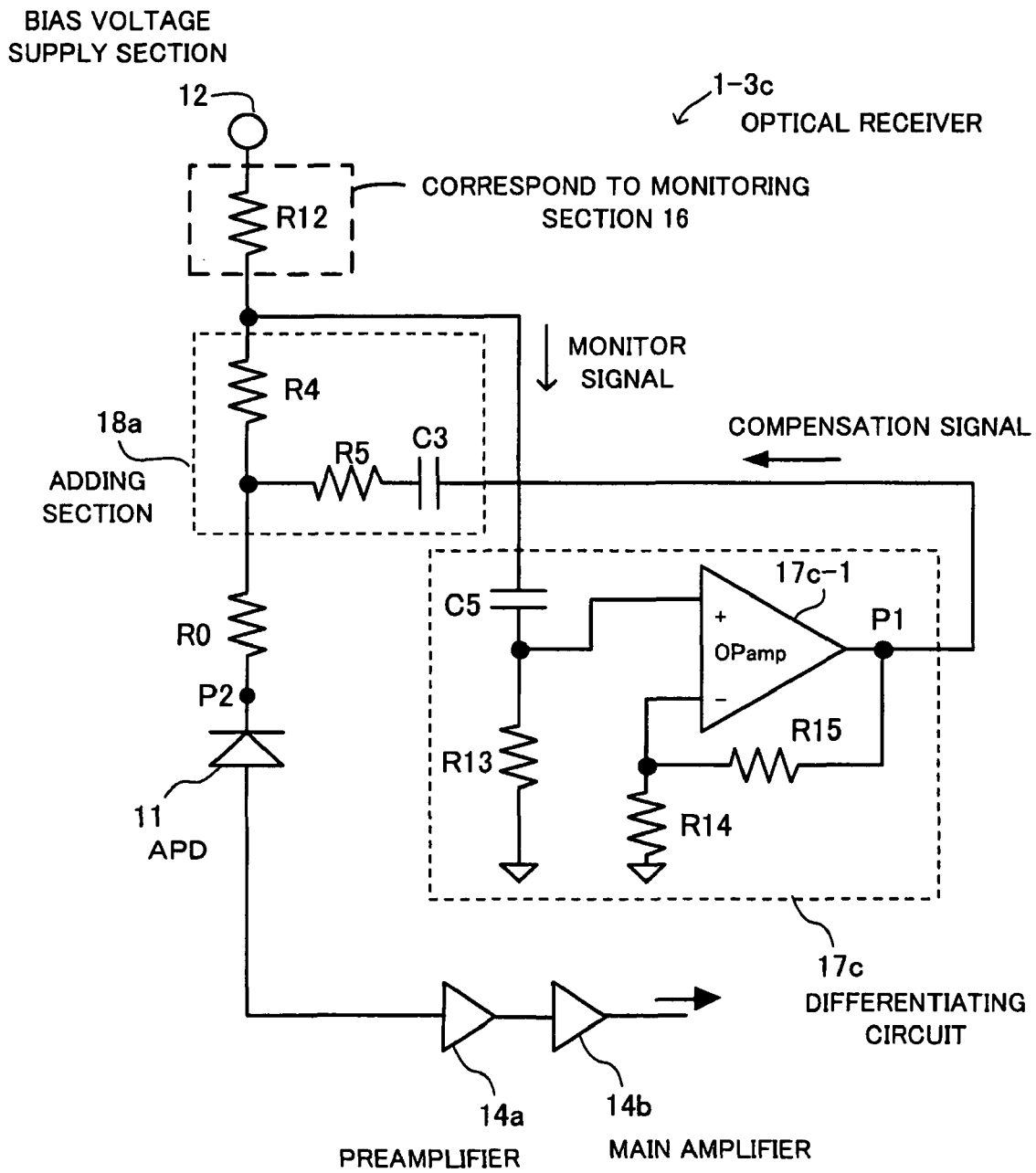
FIG. 13 illustrates a third example of the structure of the optical receiver.

A third example of the structure of the optical receiver 1-3 will now be described. FIG. 13 illustrates a third example of the structure of the optical receiver 1-3. An optical receiver 1-3c comprises an APD 11, a bias voltage supply section 12, a preamplifier 14a, a main amplifier 14b, a differentiating circuit 17c, an adding section 18a, and a resistor R12.

One end of the resistor R12 is connected to an output side of the bias voltage supply section 12 and another end of the resistor R12 is connected to one end of a resistor R4 included in the adding section 18a and to one end of a condenser C5 included in the differentiating circuit 17c.

The differentiating circuit 17c corresponding to the signal processing section 17 depicted in FIG. 8 includes resistors R13, R14, and R15, the condenser C5, and an operational amplifier 17c-1. Another end of the condenser C5 is connected to one end of the resistor R13 and an input side (+) of the operational amplifier 17c-1. Another end of the resistor R13 is connected to GND. One end of the resistor R14 is connected to an input side (−) of the operational amplifier 17c-1 and one end of the resistor R15. Another end of the resistor R14 is connected to GND. An output side of the operational amplifier 17c-1 is connected to another end of the resistor R15 and one end of a condenser C3.

With the optical receiver 1-3c which is taken as the third example of the structure of the optical receiver 1-3, the current mirror circuit 16-1 is not used as the monitoring section 16. The resistor R12 is connected between the output side of the bias voltage supply section 12 and the adding section 18a and current which flows because of a drop in bias voltage (change in current caused by a drop in bias voltage) is transmitted to the differentiating circuit 17c as a monitor signal. In addition, the differentiating circuit 17c performs differentiation by CR (by the condenser C5 and the resistor R13) and the operational amplifier 17c-1 performs non-inverting amplification. Waveforms (which indicate current that passes through a resistor R0, a compensation signal, and a bias voltage increase signal) in the optical receiver 1-3c which is taken as the third example of the structure of the optical receiver 1-3 have the same shapes as those of the waveforms depicted in FIG. 11, so descriptions of them will be omitted.

Figure 14:
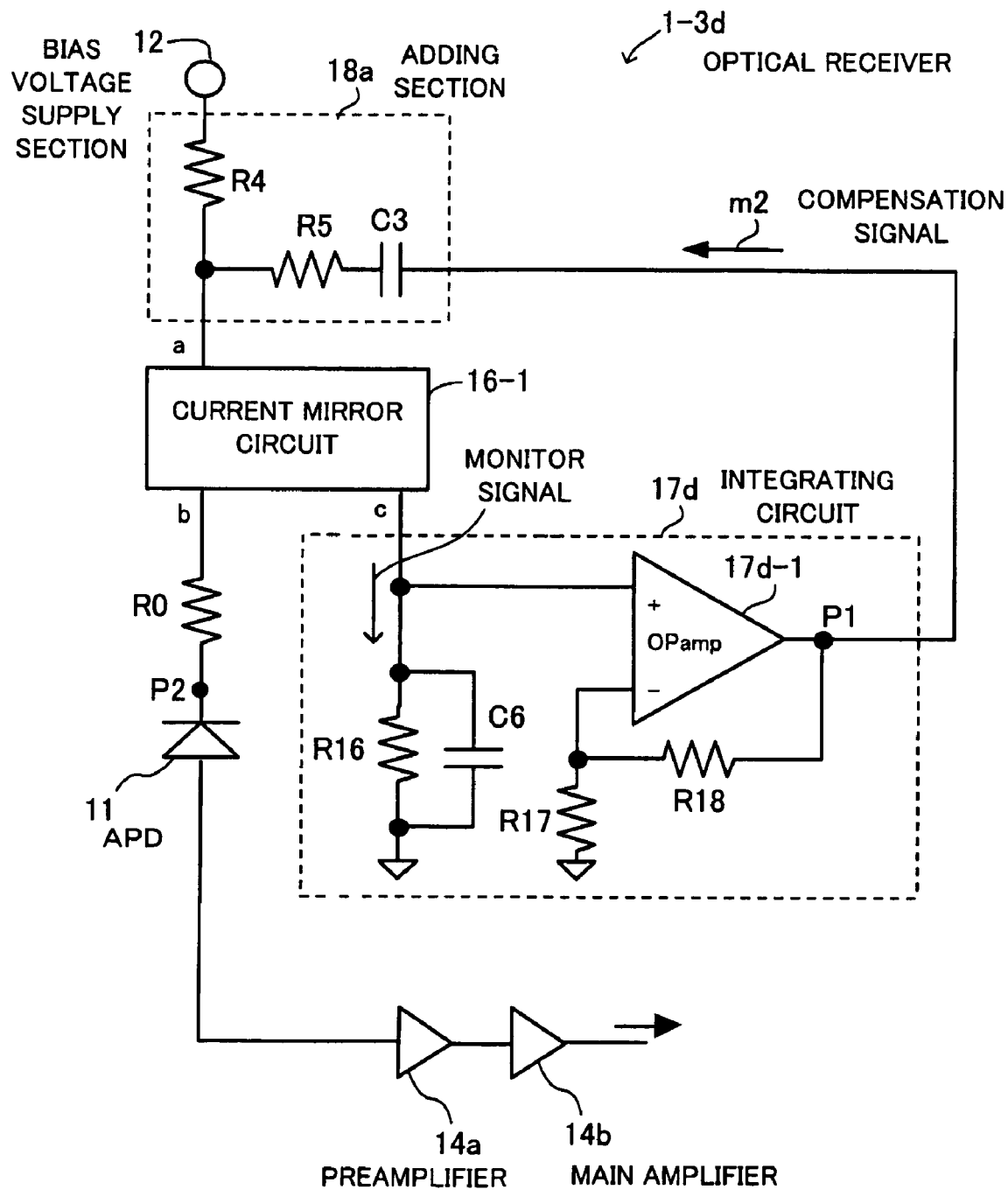
FIG. 14 illustrates a fourth example of the structure of the optical receiver.

A fourth example of the structure of the optical receiver 1-3 will now be described. FIG. 14 illustrates a fourth example of the structure of the optical receiver 1-3. An optical receiver 1-3d comprises an APD 11, a bias voltage supply section 12, a preamplifier 14a, a main amplifier 14b, a current mirror circuit 16-1, an integrating circuit 17d, and an adding section 18a.

The integrating circuit 17d corresponding to the signal processing section 17 depicted in FIG. 8 includes resistors R16, R17, and R18, a condenser C6, and an operational amplifier 17d-1. One end of the resistor R16 is connected to an output side c of the current mirror circuit 16-1, one end of the condenser C6, and an input side (+) of the operational amplifier 17d-1. Another end of the resistor R16 is connected to another end of the condenser C6 and GND. One end of the resistor R17 is connected to an input side (−) of the operational amplifier 17d-1 and one end of the resistor R18. Another end of the resistor R17 is connected to GND. An output side of the operational amplifier 17d-1 is connected to another end of the resistor R18 and one end of a condenser C3.

A monitor signal inputted to the integrating circuit 17d is integrated by CR (by the condenser CG and the resistor R16) and an integral waveform is generated. The value of the resistor R16 is a primary parameter which has an influence on a change in time constant. Time width B which depends on a time constant can be adjusted mainly by the value of the resistor R16. In addition, an integral signal the time width B of which is adjusted can be amplified (amplified and not inverted) by the operational amplifier 17d-1, so height H can be adjusted.

Figure 15:
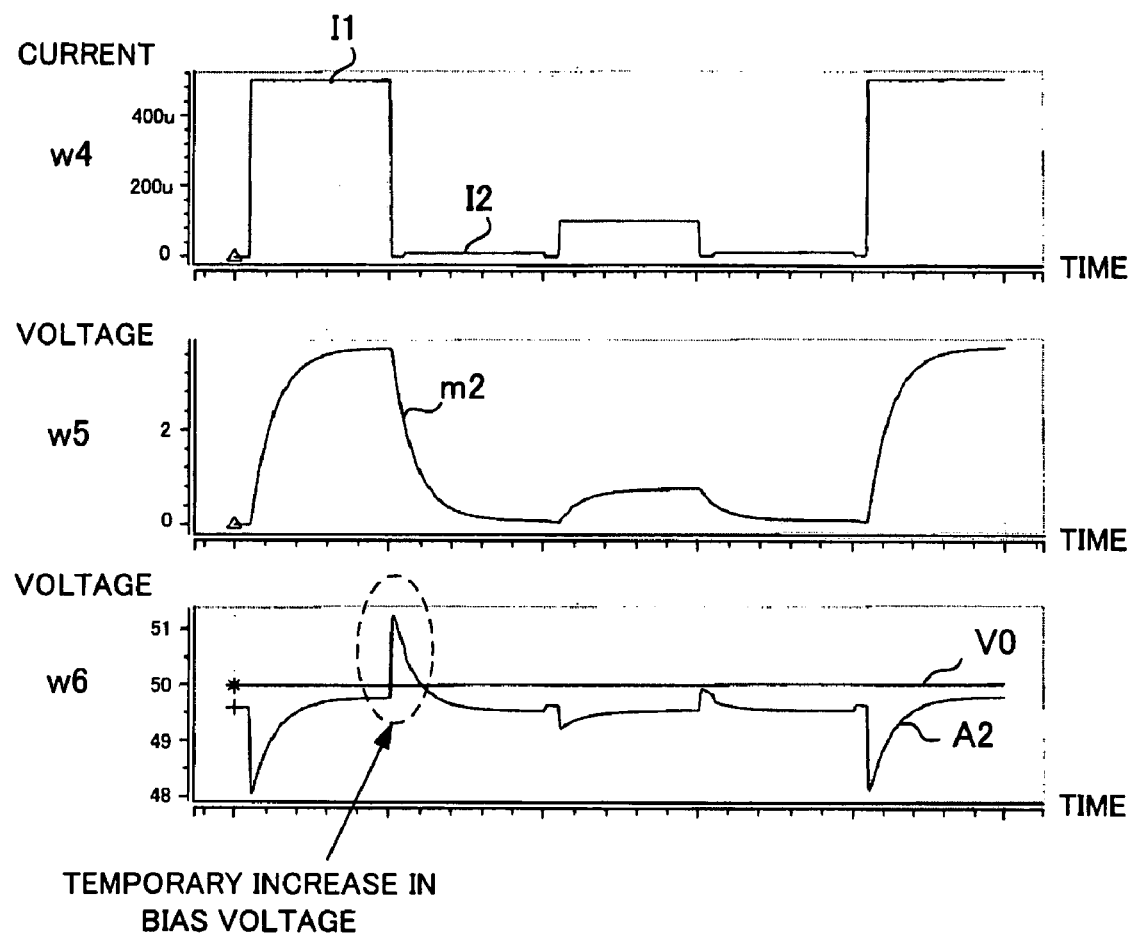
FIG. 15 illustrates each waveform in the optical receiver.

FIG. 15 illustrates each waveform in the optical receiver 1-3d. A waveform w4 indicates current which passes through a resistor R0, a horizontal axis indicates time, and a vertical axis indicates current. A waveform w5 indicates a compensation signal m2 which is outputted from the integrating circuit 17d and which is measured at a position P1 (depicted in FIG. 14), a horizontal axis indicates time, and a vertical axis indicates voltage. A waveform w6 indicates a bias voltage increase signal A2 after multiplication factor compensation which is measured at a position P2 (depicted in FIG. 14), and original bias voltage V0 supplied from the bias voltage supply section 12, a horizontal axis indicates time, and a vertical axis indicates voltage.

A strong current I1 (corresponding to a high optical level packet) changes to a weak current I2 (corresponding to a low optical level packet) on the waveform w4 at a point of time. At this point of time the compensation signal m2 having an integral waveform is generated on the waveform w5. The waveform w6 indicates the bias voltage increase signal A2 generated by adding (superimposing) the compensation signal m2 to the bias voltage V0. As can be seen from the waveform 6, bias voltage temporarily increases at the above point of time.

As has been described, with the optical receiver 1-3d the integrating circuit 17d integrates the monitor signal, and controls the time constant of the integral waveform. By doing so, the integrating circuit 17d sets bias voltage increase time to predetermined multiplication factor return time. After setting the time constant, the integrating circuit 17d amplifies the integral waveform to a predetermined level, sets the amount of an increase in bias voltage, and generates the compensation signal m2. The adding section 18a adds the compensation signal m2 to the bias voltage, generates the bias voltage increase signal for multiplication factor compensation, and supplies the bias voltage increase signal to the APD 11.

As a result, multiplication factor return time (time width B which depends on a time constant) and the amount of an increase (height H) of the bias voltage increase signal can be adjusted arbitrarily. That is to say, the time width B and height H of the bias voltage increase signal can be adjusted more flexibly. Therefore, a deterioration in receiving sensitivity can flexibly be improved with greater accuracy.

Figure 16:
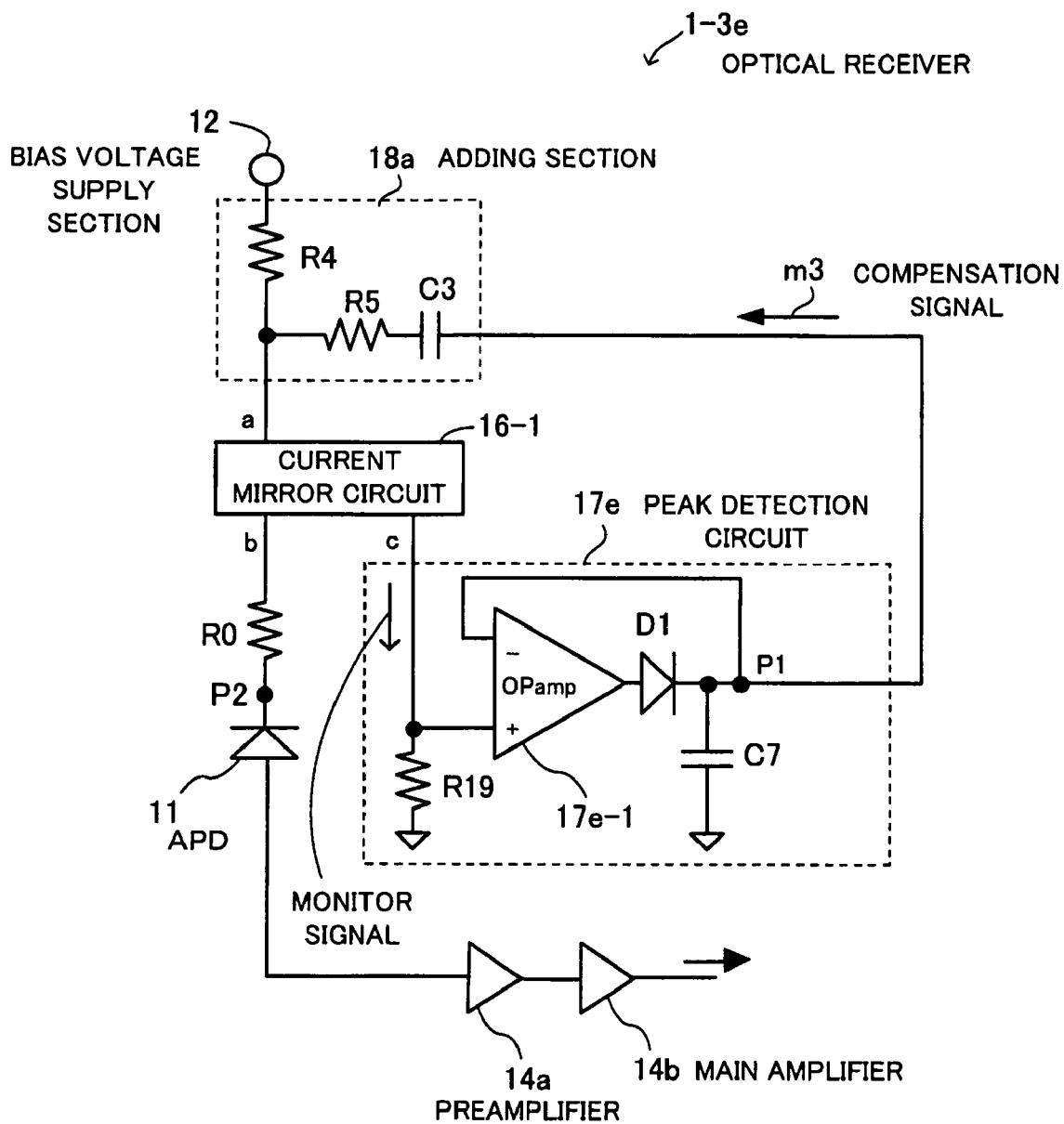
FIG. 16 illustrates a fifth example of the structure of the optical receiver.

A fifth example of the structure of the optical receiver 1-3 will now be described. FIG. 16 illustrates a fifth example of the structure of the optical receiver 1-3. An optical receiver 1-3e comprises an APD 11, a bias voltage supply section 12, a preamplifier 14a, a main amplifier 14b, a current mirror circuit 16-1, a peak detection circuit 17e, and an adding section 18a. With the optical receiver 1-3e taken as the fifth example of the structure of the optical receiver 1-3, the peak of a monitor signal is detected and a peak detection waveform is used as a compensation signal.

The peak detection circuit 17e corresponding to the signal processing section 17 depicted in FIG. 8 includes a resistor R19, a condenser C7, a diode D1, and an operational amplifier 17e-1. One end of the resistor R19 is connected to an output side c of the current mirror circuit 16-1 and an input side (+) of the operational amplifier 17e-1. Another end of the resistor R19 is connected to GND. An output side of the operational amplifier 17e-1 is connected to an anode of the diode D1. A cathode of the diode D1 is connected to one end of the condenser C7, an input side (−) of the operational amplifier 17e-1, and one end of a condenser C3. Another end of the condenser C7 is connected to GND.

Figure 17:
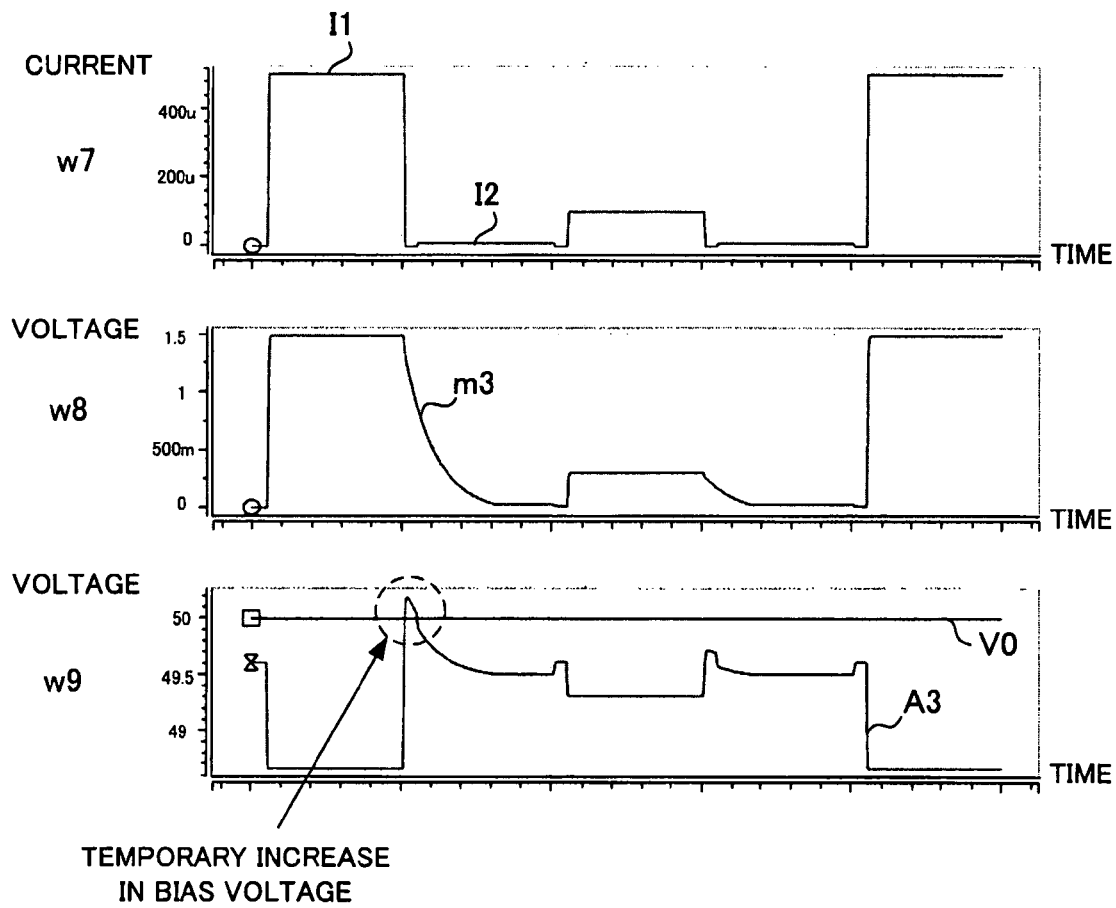
FIG. 17 illustrates each waveform in the optical receiver.

FIG. 17 illustrates each waveform in the optical receiver 1-3e. A waveform w7 indicates current which passes through a resistor R0, a horizontal axis indicates time, and a vertical axis indicates current. A waveform w8 indicates a compensation signal m3 which is outputted from the peak detection circuit 17e and which is measured at a position P1 (depicted in FIG. 16), a horizontal axis indicates time, and a vertical axis indicates voltage. A waveform w9 indicates a bias voltage increase signal A3 after multiplication factor compensation which is measured at a position P2 (depicted in FIG. 16), and original bias voltage V0 supplied from the bias voltage supply section 12, a horizontal axis indicates time, and a vertical axis indicates voltage.

A strong current I1 (corresponding to a high optical level packet) changes to a weak current I2 (corresponding to a low optical level packet) on the waveform w7 at a point of time. At this point of time the compensation signal m3 having a waveform the peak of which is kept at a constant level is generated on the waveform w8. The rising and falling of the waveform indicative of the response characteristic of the peak detection circuit 17e depend on a time constant and differ from each other. That is to say, the rising is sharp and the falling is gradual because of a discharge. Therefore, the output from the peak detection circuit 17e has a waveform which resembles an integral waveform (and which differs from an integral waveform in that the rising is sharp.)

The waveform w9 indicates the bias voltage increase signal A3 generated by adding (superimposing) the compensation signal m3 to the bias voltage V0. As can be seen from the waveform 9, bias voltage temporarily increases at the above point of time.

Figure 18:
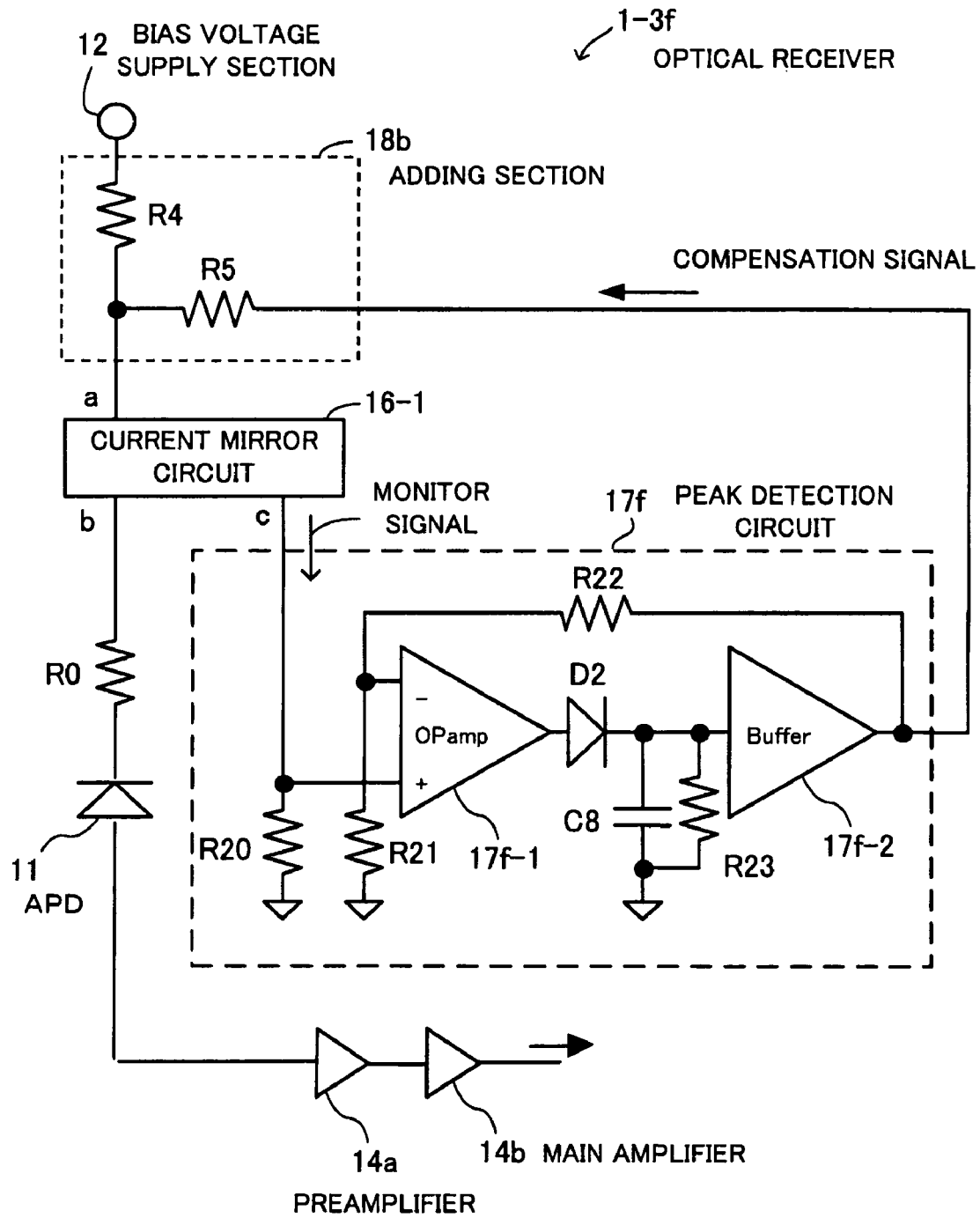
FIG. 18 illustrates a sixth example of the structure of the optical receiver.

A sixth example of the structure of the optical receiver 1-3 will now be described. FIG. 18 illustrates a sixth example of the structure of the optical receiver 1-3. An optical receiver 1-3f comprises an APD 11, a bias voltage supply section 12, a preamplifier 14a, a main amplifier 14b, a current mirror circuit 16-1, a peak detection circuit 17f, and an adding section 18b.

The peak detection circuit 17e included in the optical receiver 1-3e taken as the fifth example of the structure of the optical receiver 1-3 does not increase signal amplitude. Therefore, with the optical receiver 1-3f taken as the sixth example of the structure of the optical receiver 1-3, a circuit is added to an operational amplifier included in the peak detection circuit 17f so that the peak detection circuit 17f can perform amplification.

The adding section 18b includes resistors R4 and R5. One end of the resistor R4 is connected to an output side of the bias voltage supply section 12 and another end of the resistor R4 is connected to one end of the resistor R5 and an input side a of the current mirror circuit 16-1. Another end of the resistor R5 is connected to an output side of the peak detection circuit 17f.

The peak detection circuit 17f corresponding to the signal processing section 17 depicted in FIG. 8 includes resistors R20, R21, R22, and R23, a condenser C8, a diode D2, an operational amplifier 17f-1, and a buffer 17f-2. One end of the resistor R20 is connected to an output side c of the current mirror circuit 16-1 and an input side (+) of the operational amplifier 17f-1. Another end of the resistor R20 is connected to GND.

One end of the resistor R21 is connected to an input side (−) of the operational amplifier 17f-1 and one end of the resistor R22. Another end of the resistor R21 is connected to GND. An output side of the operational amplifier 17f-1 is connected to an anode of the diode D2. A cathode of the diode D2 is connected to one end of the condenser C8, one end of the resistor R23, and an input side of the buffer 17f-2.

Another end of the condenser C8 is connected to another end of the resistor R23 and GND. An output side of the buffer 17f-2 is connected to another end of the resistor R22 and the other end of the resistor R5. Waveforms (which indicate current that passes through a resistor R0, a compensation signal, and a bias voltage increase signal) in the optical receiver 1-3f have the same shapes as those of the waveforms depicted in FIG. 17, so descriptions of them will be omitted.

Figure 19:
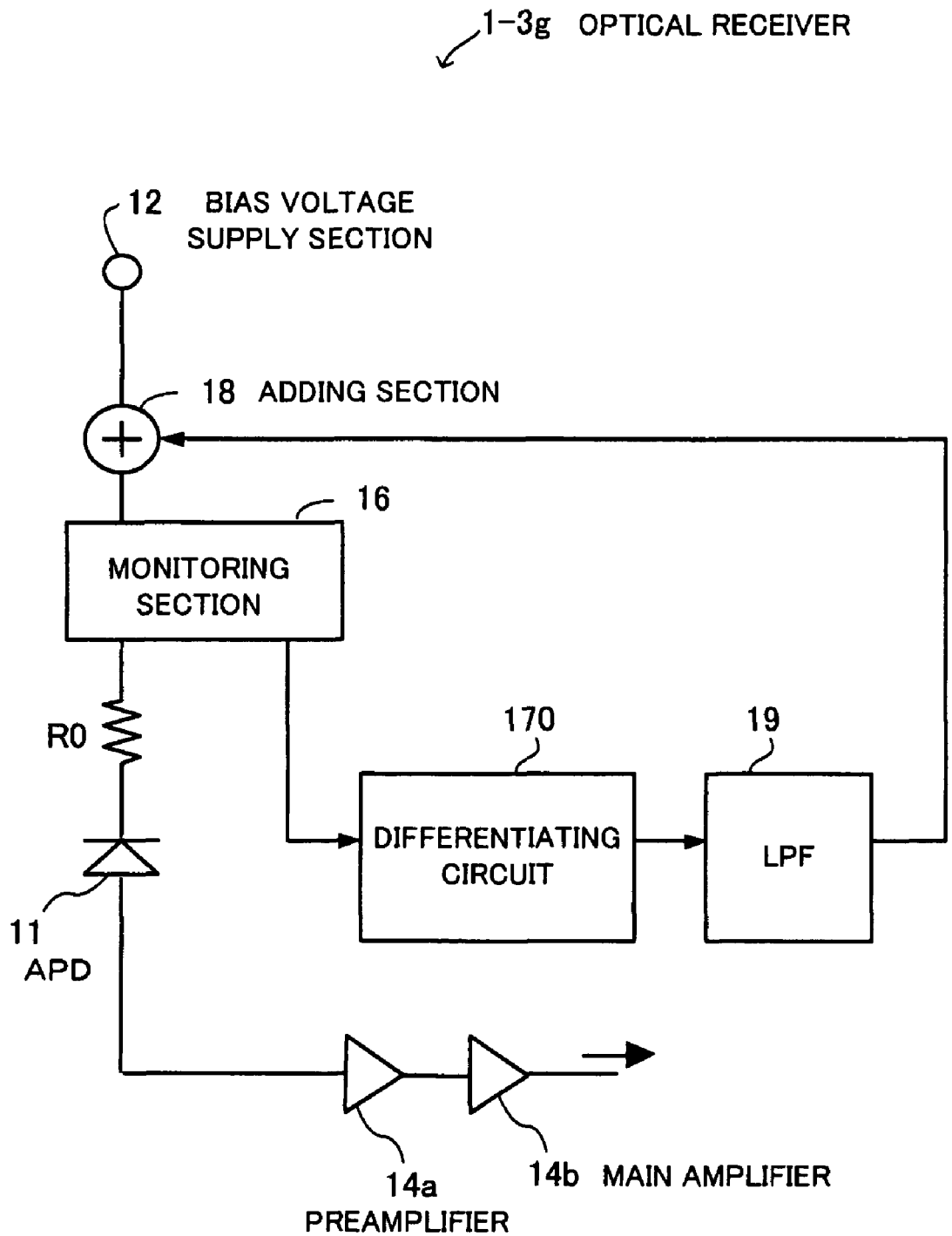
FIG. 19 illustrates a modification of the optical receiver.

Modifications of the optical receiver 1-3 will now be described. FIG. 19 illustrates a modification of the optical receiver 1-3. An optical receiver 1-3g includes a low-pass filter 19 which removes high-frequency noise outputted from the differentiating circuit (corresponding to a differentiating circuit 170 depicted in FIG. 19) depicted in FIG. 10, 12, or 13.

Figure 20:
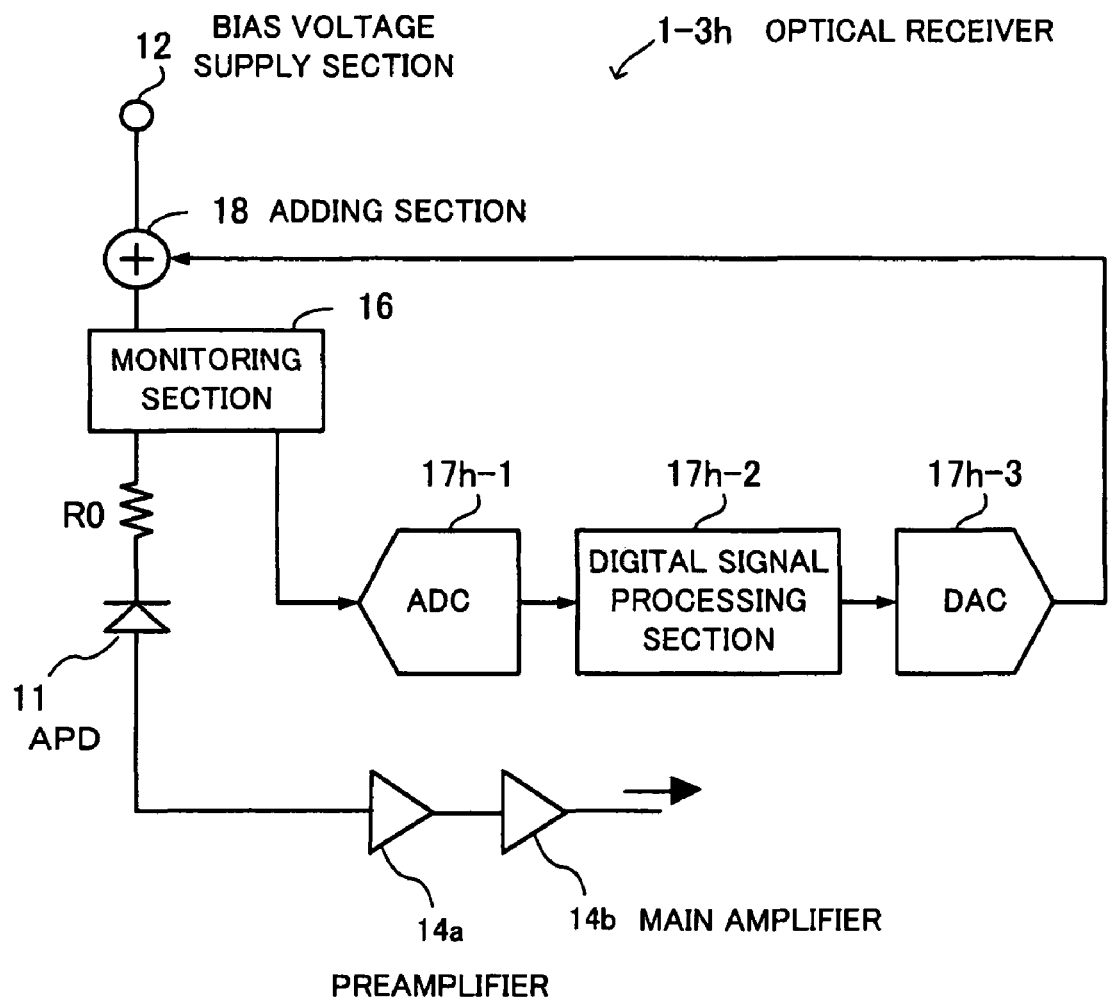
FIG. 20 illustrates a modification of the optical receiver.

FIG. 20 illustrates a modification of the optical receiver 1-3. An optical receiver 1-3h includes a signal processing section 17 which performs digital signal processing. The signal processing section 17 includes an A/D converter 17h-1 which converts a monitor signal to a digital signal, a digital signal processing section 17h-2 which processes the digital signal outputted from the A/D converter 17h-1 and which generates a digital compensation signal, and a D/A converter 17h-3 which converts the digital compensation signal to an analog compensation signal and which transmits the analog compensation signal to an adding section 18.

An optical receiver according to a fourth embodiment will now be described. With an optical receiver according to a fourth embodiment, the head of an optical packet is recognized on the basis of a detection pulse indicative of the head of the optical packet and control is exercised for temporarily increasing bias voltage.

Figure 21:
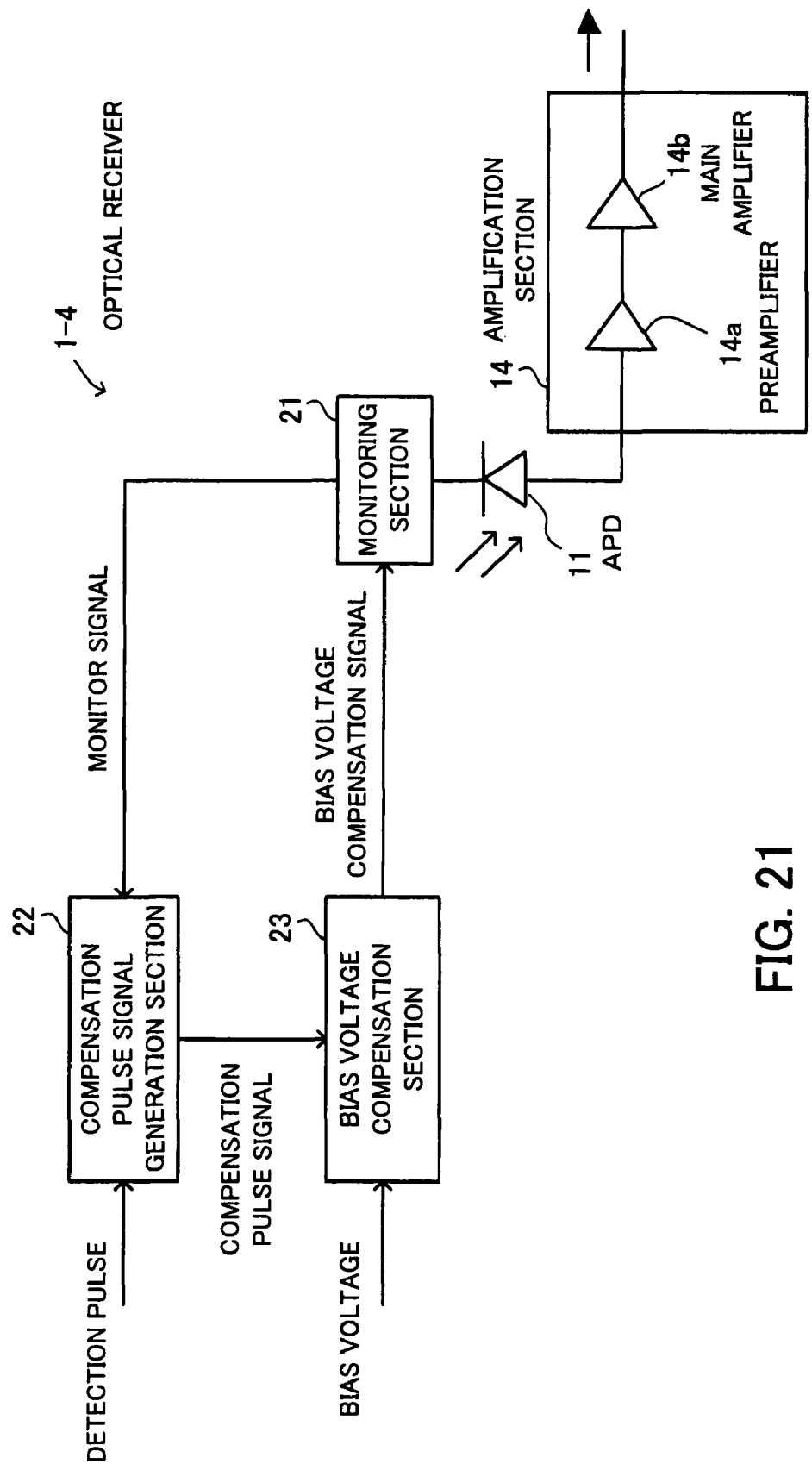
FIG. 21 illustrates the structure of an optical receiver according to a fourth embodiment.

FIG. 21 illustrates the structure of an optical receiver according to a fourth embodiment. An optical receiver 1-4 comprises an APD 11, an amplification section 14 including a preamplifier 14a and a main amplifier 14b, a monitoring section 21, a compensation pulse signal generation section 22, and a bias voltage compensation section 23 and receives optical packets burst-transmitted.

The monitoring section 21 monitors the input level of each optical packet or an electrical signal to which each optical packet is converted by the APD 11. The compensation pulse signal generation section 22 generates a compensation pulse signal on the basis of a monitor signal with a detection pulse indicative of the detection of the optical packet as a trigger. The bias voltage compensation section 23 adds the compensation pulse signal to bias voltage applied to the APD 11, and generates a bias voltage compensation signal temporarily increased. In FIG. 21, the bias voltage compensation signal is supplied to the APD 11 via the monitoring section 21.

Figure 22:
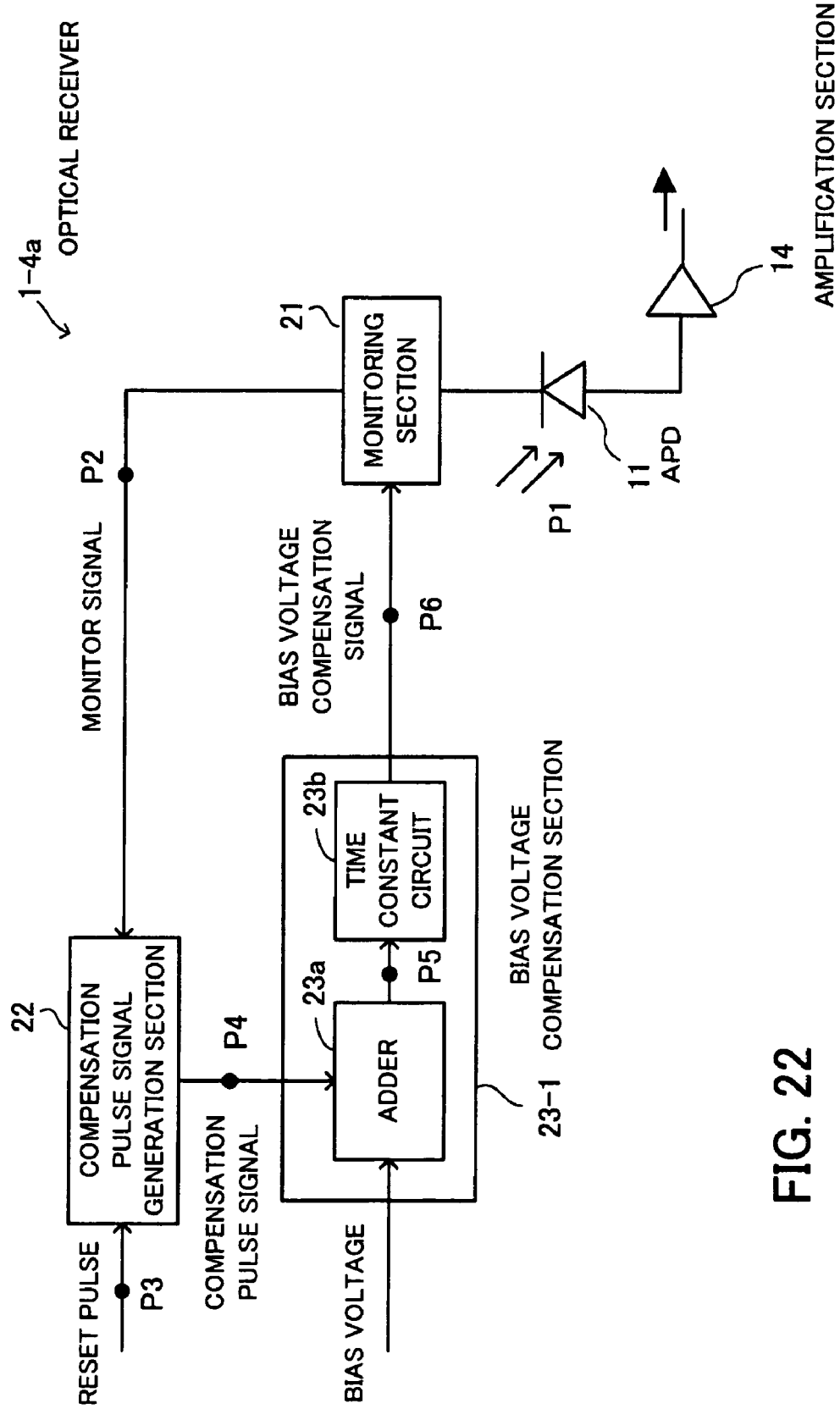
FIG. 22 illustrates a first example of the structure of the optical receiver.
Figure 23:
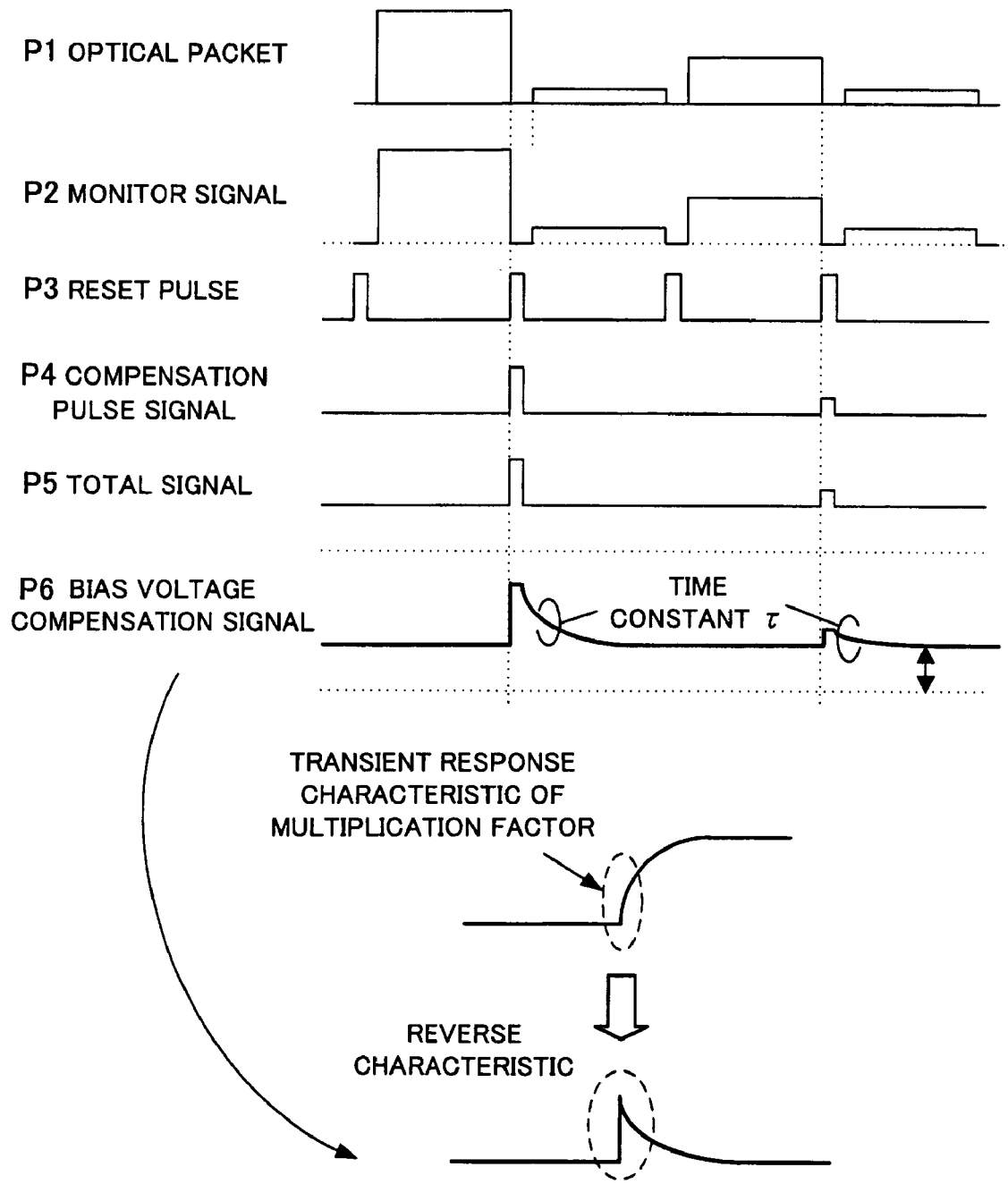
FIG. 23 is a time chart of each waveform in an optical receiver taken as the first example of the structure of the optical receiver.

A first example of the structure of the optical receiver 1-4 will now be described. FIG. 22 illustrates a first example of the structure of the optical receiver 1-4. FIG. 23 is a time chart of each waveform in an optical receiver taken as the first example of the structure of the optical receiver 1-4. An optical receiver 1-4a comprises an APD 11, an amplification section 14, a monitoring section 21, a compensation pulse signal generation section 22, and a bias voltage compensation section 23-1. The bias voltage compensation section 23-1 includes an adder 23a and a time constant circuit 23b.

If optical packets burst-transmitted are inputted as indicated by P1 of FIG. 23, the monitoring section 21 detects the input level of each optical packet (P2). The compensation pulse signal generation section 22 includes a medium in which a monitored value is stored, and determines the amplitude of compensation voltage for bias voltage applied to the APD 11 according to the monitored value.

That is to say, the compensation pulse signal generation section 22 stores in advance data (table) by which the monitored value of each monitor signal is associated with an amplitude value. When the compensation pulse signal generation section 22 receives a monitor signal, the compensation pulse signal generation section 22 determines an amplitude value according to the magnitude of a monitored value on the basis of the data and generates a pulse signal having the determined amplitude value as a compensation pulse signal (P4).

In addition, the compensation pulse signal generation section 22 outputs a compensation pulse signal (P4) with a reset pulse (P3) which indicates the inputting of an optical packet and which is transmitted from an upper system as a trigger.

The adder 23a generates a total signal (P5) by adding the compensation pulse signal to the bias voltage applied to the APD 11. If a low optical level packet is received just after receiving of a high optical level packet, the multiplication factor of the APD 11 falls because of the receiving of the high optical level packet. The multiplication factor of the APD 11 fluctuates (described above in FIG. 45) until the multiplication factor of the APD 11 returns to a predetermined value. The time constant circuit 23b controls a time constant. In this case, the time constant circuit 23b generates a bias voltage compensation signal by converting the waveform of the total signal to a waveform which exhibits a characteristic reverse to the multiplication factor fluctuation characteristic of the APD 11.

That is to say, the total signal passes through the time constant circuit 23b. By doing so, the total signal exhibits a characteristic reverse to the transient response characteristic of fluctuation in the multiplication factor of the APD 11. As a result, a bias voltage compensation signal (P6) for compensating fluctuation in the multiplication factor of the APD 11 is generated.

Figure 24:
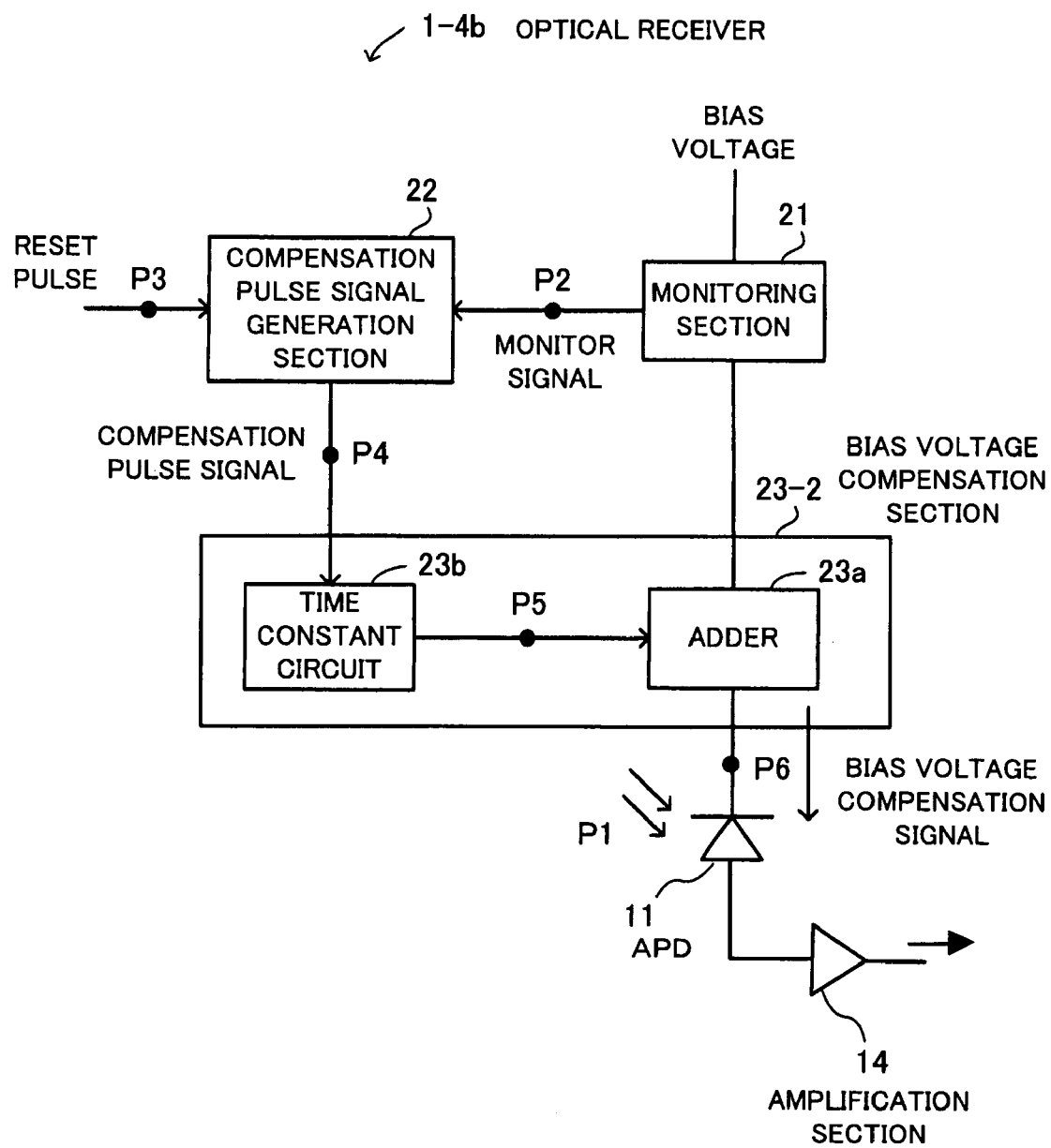
FIG. 24 illustrates a second example of the structure of the optical receiver.
Figure 25:
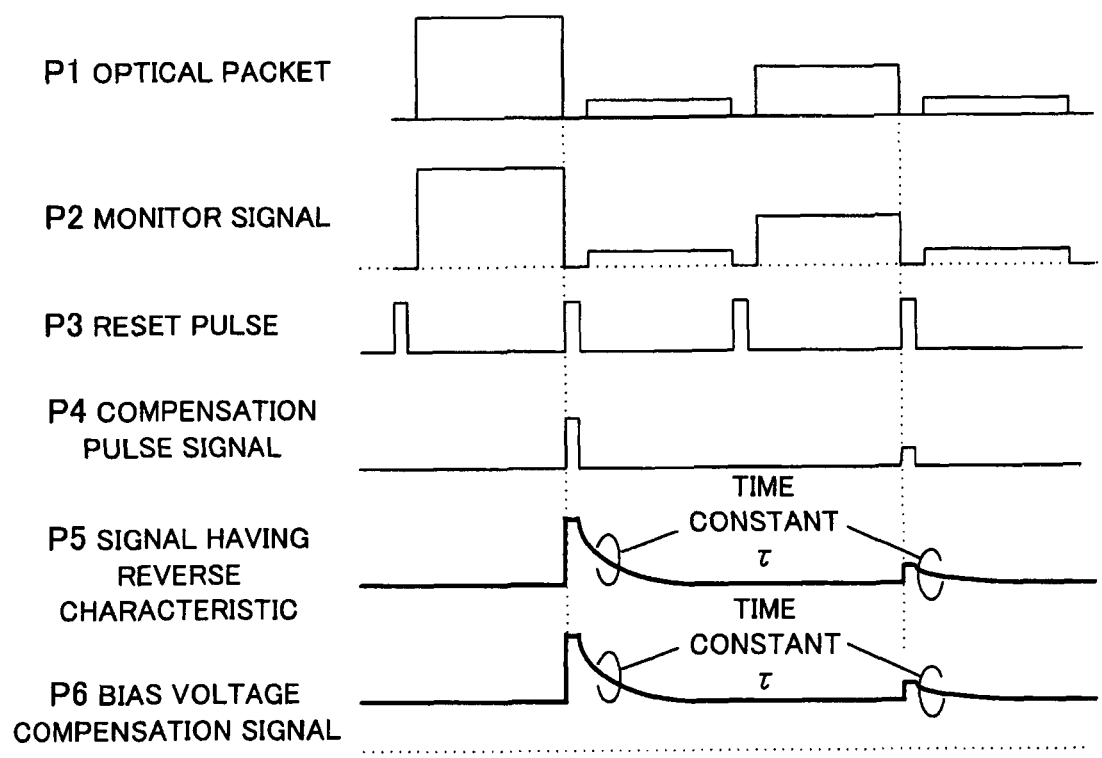
FIG. 25 is a time chart of each waveform in an optical receiver taken as the second example of the structure of the optical receiver.

A second example of the structure of the optical receiver 1-4 will now be described. FIG. 24 illustrates a second example of the structure of the optical receiver 1-4. FIG. 25 is a time chart of each waveform in an optical receiver taken as the second example of the structure of the optical receiver 1-4. An optical receiver 1-4b comprises an APD 11, an amplification section 14, a monitoring section 21, a compensation pulse signal generation section 22, and a bias voltage compensation section 23-2. The bias voltage compensation section 23-2 includes an adder 23a and a time constant circuit 23b.

If optical packets burst-transmitted are inputted as indicated by P1 of FIG. 25, the monitoring section 21 detects the input level of each optical packet (P2). The compensation pulse signal generation section 22 determines the amplitude of compensation voltage for bias voltage applied to the APD 11 according to a monitored value on the basis of data which is stored in advance and by which each monitored value is associated with an amplitude value. Then the compensation pulse signal generation section 22 generates and outputs a compensation pulse signal (P4) with a reset pulse (P3) which is supplied from an upper system as a trigger.

If a low optical level packet is received just after receiving of a high optical level packet, the multiplication factor of the APD 11 falls because of the receiving of the high optical level packet. The multiplication factor of the APD 11 fluctuates until the multiplication factor of the APD 11 returns to a predetermined value. The time constant circuit 23b controls a time constant. In this case, the time constant circuit 23b converts the waveform of the compensation pulse signal to a waveform (P5) which exhibits a characteristic reverse to the multiplication factor fluctuation characteristic of the APD 11. Then the adder 23a generates a bias voltage compensation signal (P6) by adding a signal having the waveform which exhibits the reverse characteristic to the bias voltage, and supplies the bias voltage compensation signal to the APD 11.

Figure 26:
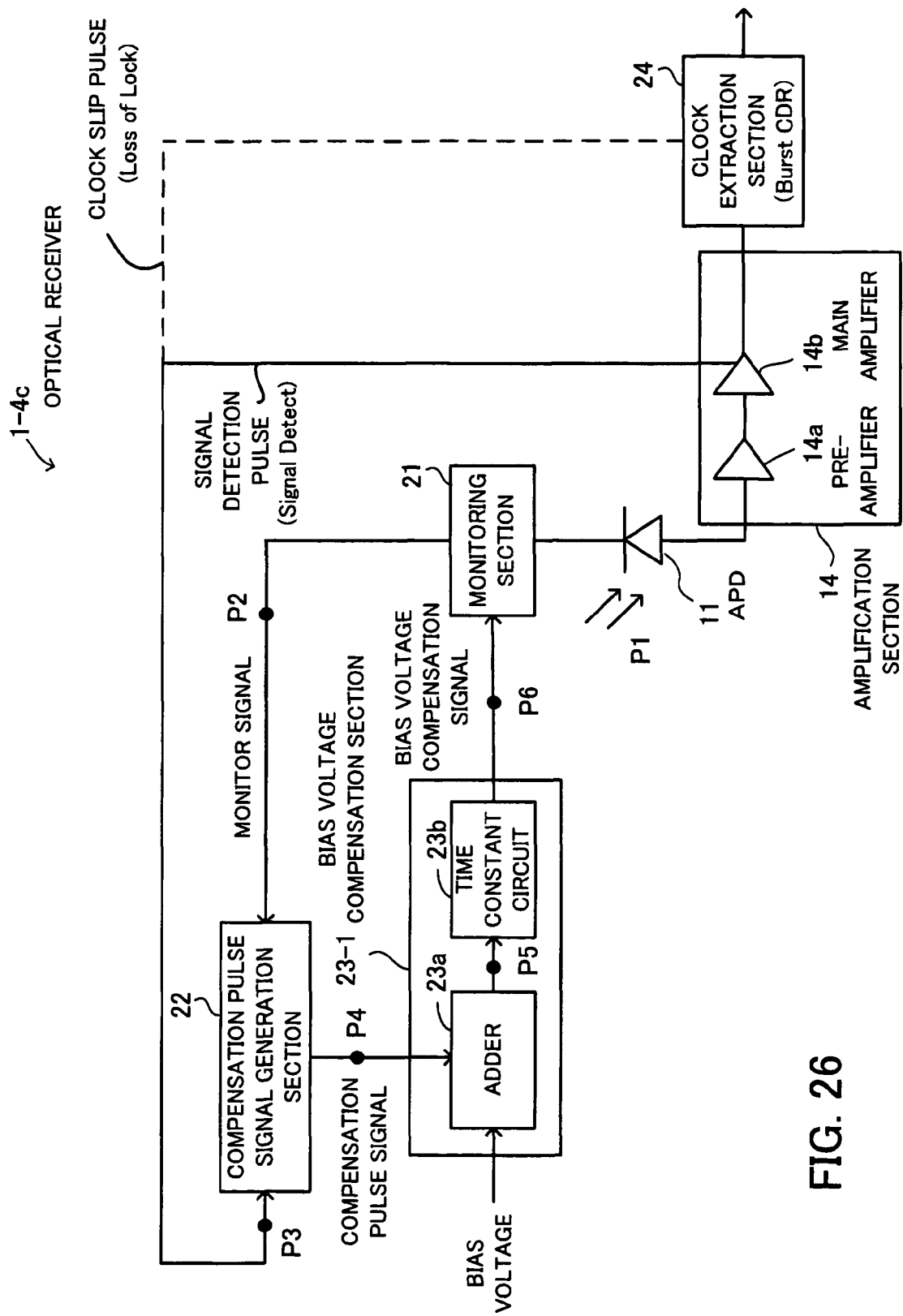
FIG. 26 illustrates a third example of the structure of the optical receiver.
Figure 27:
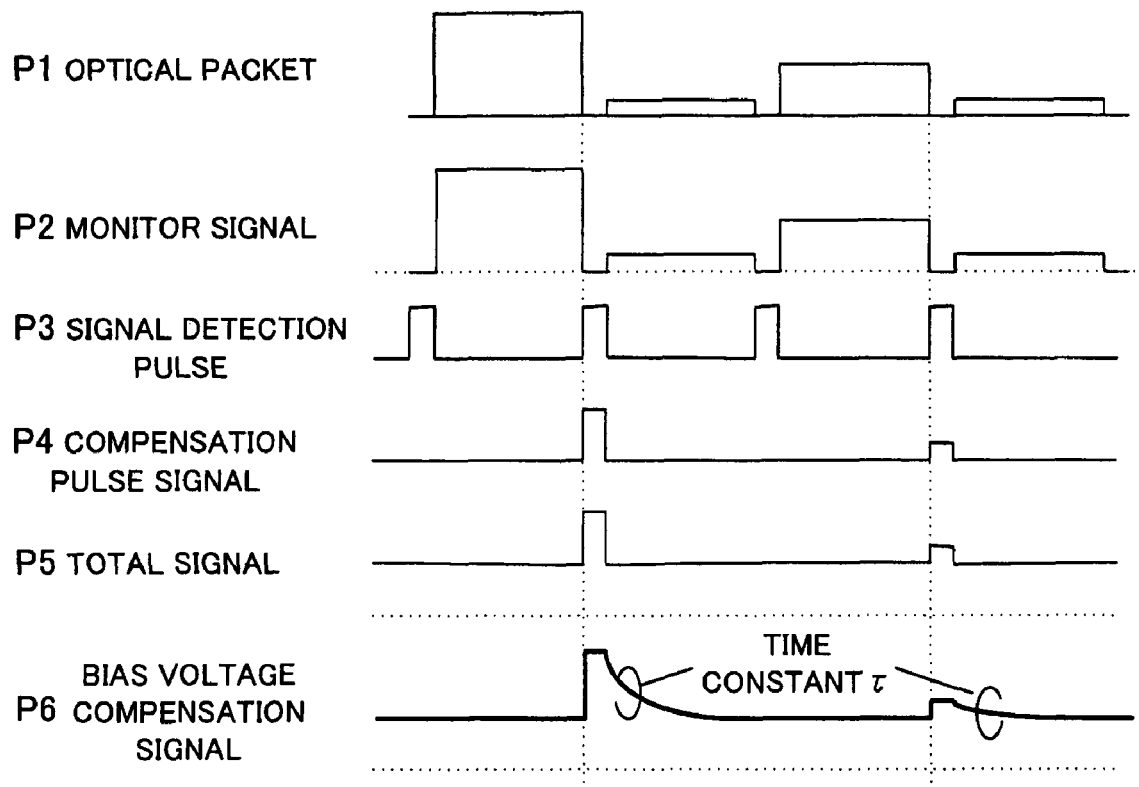
FIG. 27 is a time chart of each waveform in an optical receiver taken as the third example of the structure of the optical receiver.

A third example of the structure of the optical receiver 1-4 will now be described. FIG. 26 illustrates a third example of the structure of the optical receiver 1-4. FIG. 27 is a time chart of each waveform in an optical receiver taken as the third example of the structure of the optical receiver 1-4. An optical receiver 1-4c comprises an APD 11, an amplification section 14 (including a preamplifier 14a and a main amplifier 14b), a monitoring section 21, a compensation pulse signal generation section 22, a bias voltage compensation section 23-1, and a clock extraction section 24. The bias voltage compensation section 23-1 includes an adder 23a and a time constant circuit 23b. The clock extraction section 24 is a clock data recovery (CDR) which extracts a clock used for performing a data reproduction process from a signal outputted from the main amplifier 14b.

If optical packets burst-transmitted are inputted as indicated by P1 of FIG. 27, the monitoring section 21 detects the input level of each optical packet (P2). The compensation pulse signal generation section 22 determines the amplitude of compensation voltage for bias voltage applied to the APD 11 according to a monitored value on the basis of data which is stored in advance and by which each monitored value is associated with an amplitude value. Then the compensation pulse signal generation section 22 generates and outputs a compensation pulse signal (P4) with a signal detection pulse (signal detect (P3)) generated by the main amplifier 14b as a trigger.

The adder 23a generates a total signal (P5) by adding the compensation pulse signal to bias voltage applied to the APD 11. If a low optical level packet is received just after receiving of a high optical level packet, the multiplication factor of the APD 11 falls because of the receiving of the high optical level packet. The multiplication factor of the APD 11 fluctuates until the multiplication factor of the APD 11 returns to a predetermined value. The time constant circuit 23b controls a time constant. In this case, the time constant circuit 23b generates a bias voltage compensation signal by converting the waveform of the total signal to a waveform which exhibits a characteristic reverse to the multiplication factor fluctuation characteristic of the APD 11.

That is to say, the total signal passes through the time constant circuit 23b. By doing so, the total signal exhibits a characteristic reverse to the transient response characteristic of fluctuation in the multiplication factor of the APD 11. As a result, a bias voltage compensation signal (P6) for compensating fluctuation in the multiplication factor of the APD 11 is generated.

Figure 28:
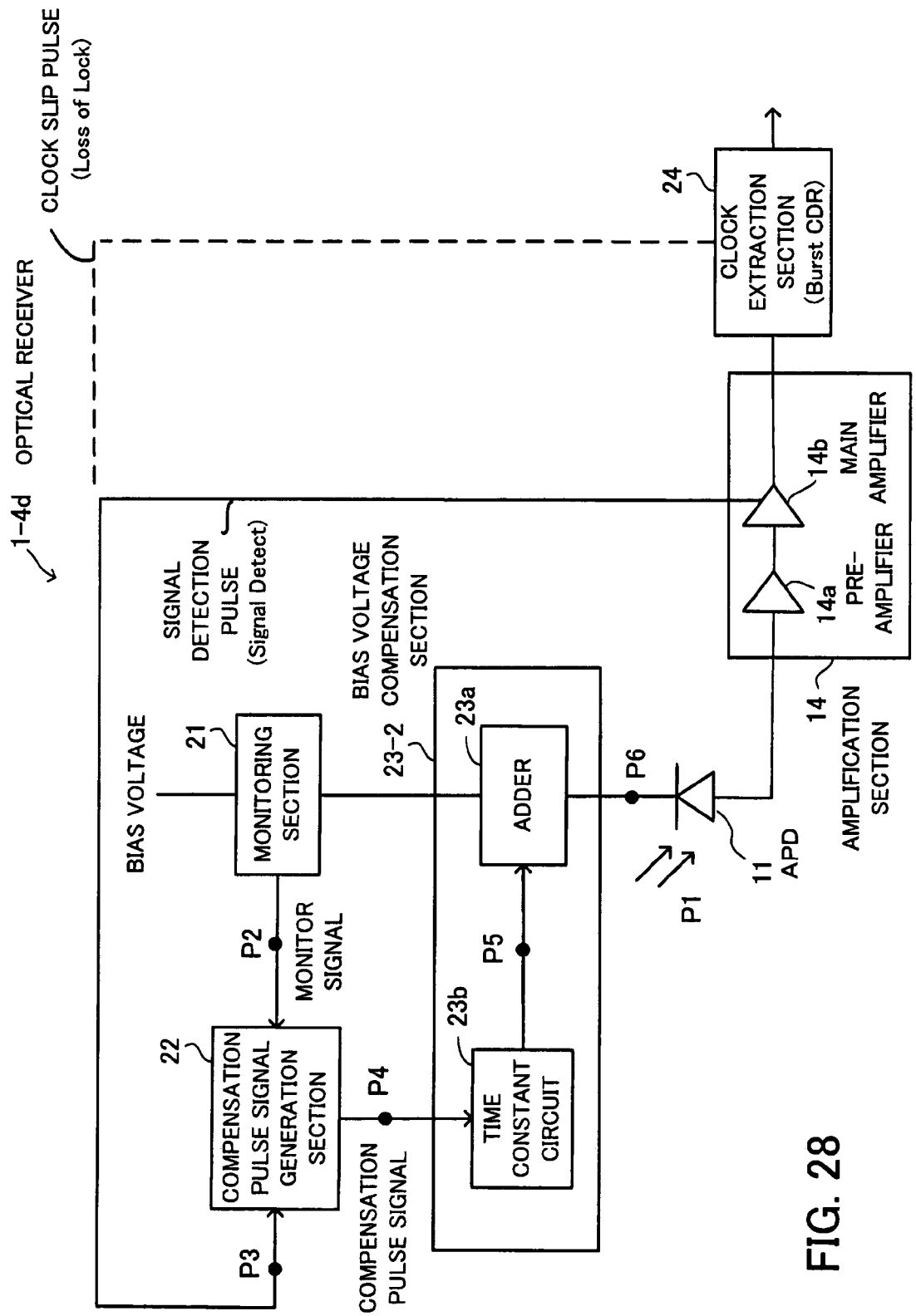
FIG. 28 illustrates a fourth example of the structure of the optical receiver.
Figure 29:
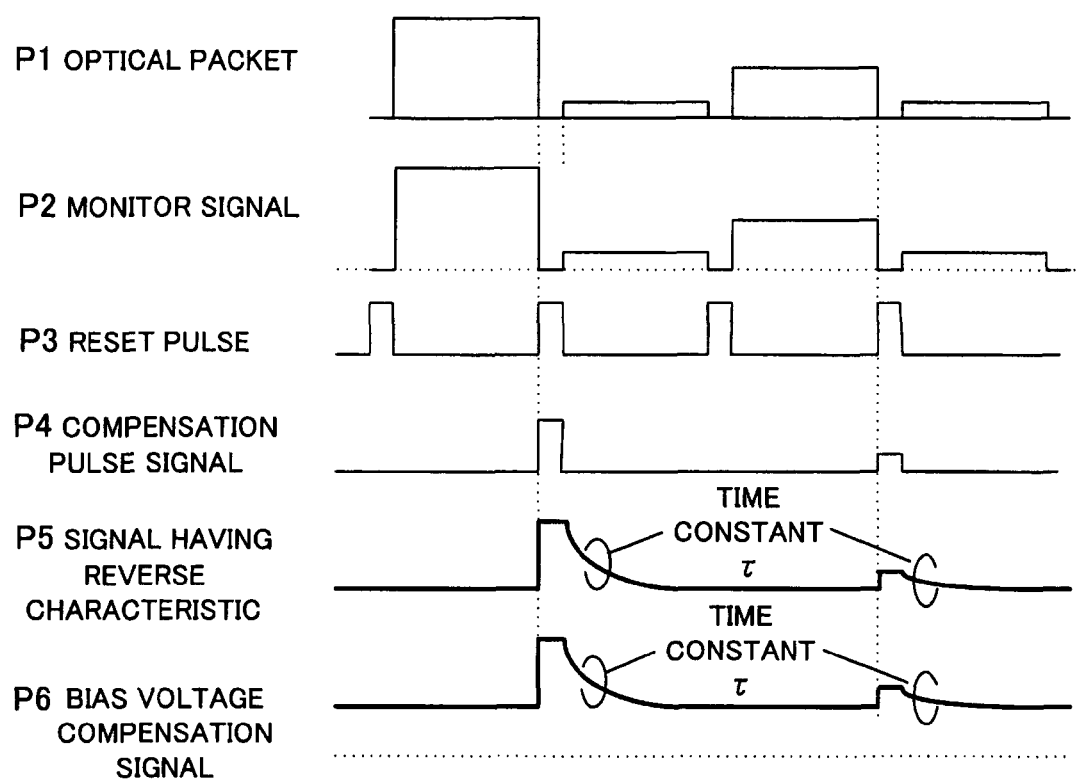
FIG. 29 is a time chart of each waveform in an optical receiver taken as the fourth example of the structure of the optical receiver.

A clock slip pulse (loss of lock) outputted from the clock extraction section 24 may be used as a detection pulse in place of a signal detection pulse (signal detect) A fourth example of the structure of the optical receiver 1-4 will now be described. FIG. 28 illustrates a fourth example of the structure of the optical receiver 1-4. FIG. 29 is a time chart of each waveform in an optical receiver taken as the fourth example of the structure of the optical receiver 1-4. An optical receiver 1-4d comprises an APD 11, an amplification section 14 (including a preamplifier 14a and a main amplifier 14b), a monitoring section 21, a compensation pulse signal generation section 22, a bias voltage compensation section 23-2, and a clock extraction section 24. The bias voltage compensation section 23-2 includes an adder 23a and a time constant circuit 23b.

If optical packets burst-transmitted are inputted as indicated by P1 of FIG. 29, the monitoring section 21 detects the input level of each optical packet (P2). The compensation pulse signal generation section 22 determines the amplitude of compensation voltage for bias voltage applied to the APD 11 according to a monitored value on the basis of data which is stored in advance and by which each monitored value is associated with an amplitude value. Then the compensation pulse signal generation section 22 generates and outputs a compensation pulse signal (P4) with a signal detection pulse (signal detect (P3)) generated by the main amplifier 14b as a trigger.

If a low optical level packet is received just after receiving of a high optical level packet, the multiplication factor of the APD 11 falls because of the receiving of the high optical level packet. The multiplication factor of the APD 11 fluctuates until the multiplication factor of the APD 11 returns to a predetermined value. The time constant circuit 23b controls a time constant. In this case, the time constant circuit 23b converts the waveform of the compensation pulse signal to a waveform (P5) which exhibits a characteristic reverse to the multiplication factor fluctuation characteristic of the APD 11. Then the adder 23a generates a bias voltage compensation signal (P6) by adding a signal having the waveform which exhibits the reverse characteristic to the bias voltage.

A clock slip pulse (loss of lock) outputted from the clock extraction section 24 may be used as a detection pulse in place of a signal detection pulse (signal detect).

Figure 30:
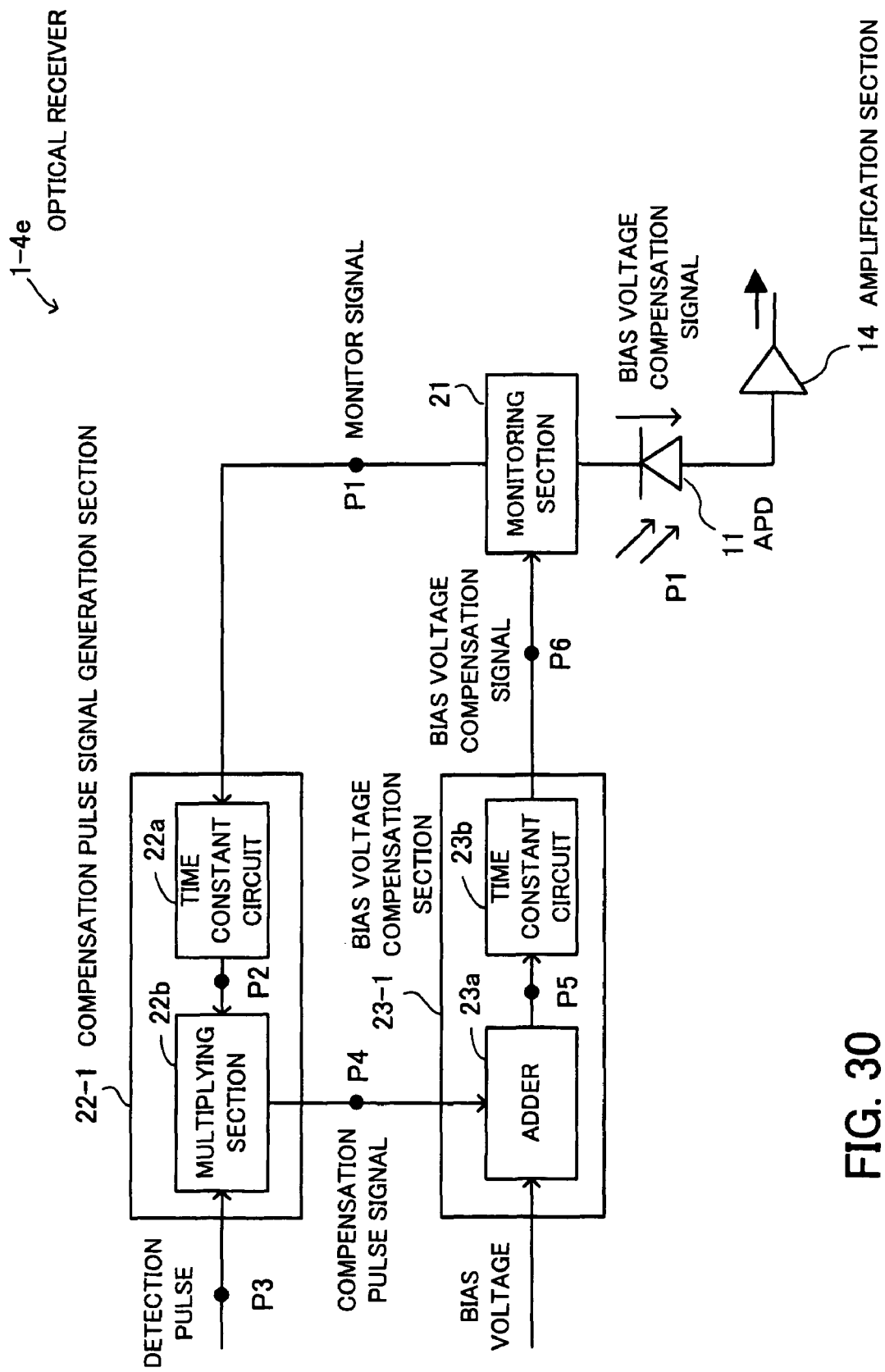
FIG. 30 illustrates a modification of the optical receiver according to the fourth embodiment.
Figure 31:
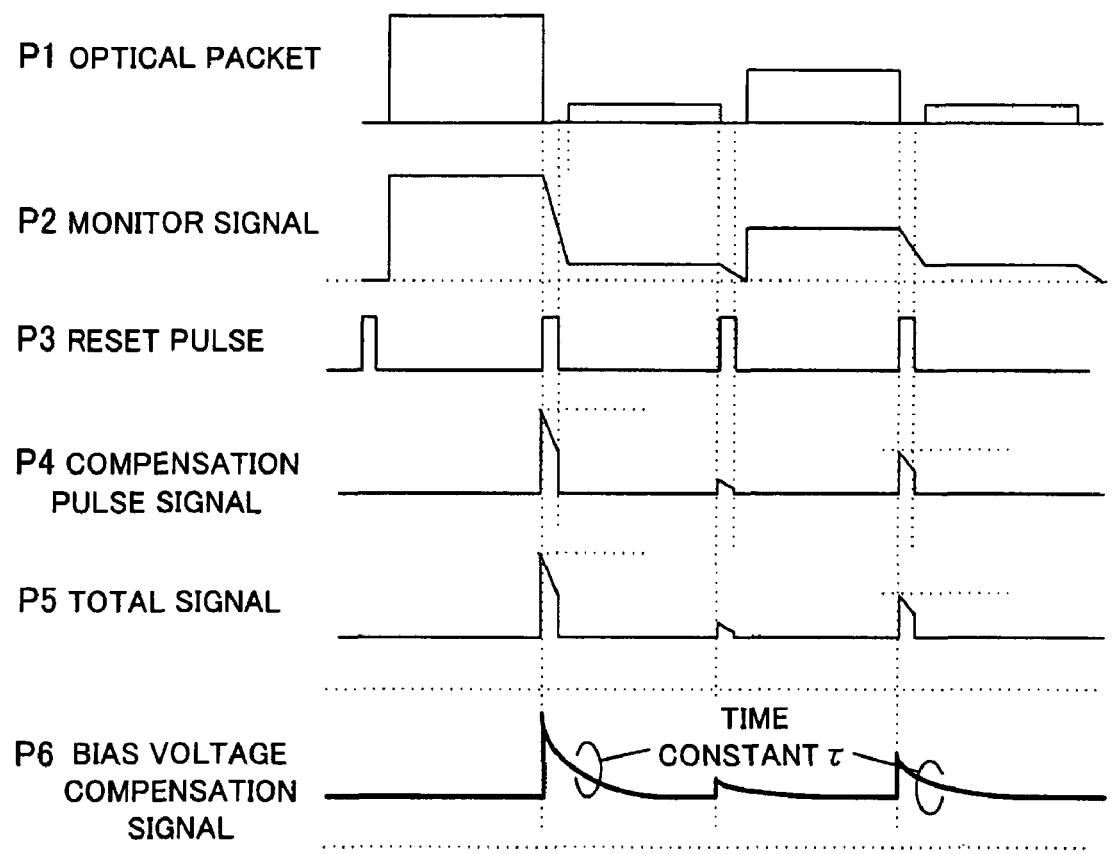
FIG. 31 is a time chart of each waveform in the modification of the optical receiver according to the fourth embodiment.

Modifications of the optical receiver 1-4 will now be described. FIG. 30 illustrates a modification of the optical receiver 1-4 according to the fourth embodiment. FIG. 31 is a time chart of each waveform in the modification of the optical receiver 1-4 according to the fourth embodiment. An optical receiver 1-4e comprises an APD 11, an amplification section 14, a monitoring section 21, a compensation pulse signal generation section 22-1, and a bias voltage compensation section 23-1. The compensation pulse signal generation section 22-1 includes a time constant circuit 22a and a multiplying section 22b. The bias voltage compensation section 23-1 includes an adder 23a and a time constant circuit 23b.

The time constant circuit 22a controls the time constant of a pulse-like monitor signal so that the falling of the waveform of the monitor signal will be inclined (P2). The multiplying section 22b generates and outputs a waveform obtained by finding the product (logical product) of an inclined portion of the monitor signal and a detection pulse (reset pulse (P3)) as a compensation pulse signal (P4).

The adder 23a generates a total signal (P5) by adding the compensation pulse signal to bias voltage applied to the APD 11. If a low optical level packet is received just after receiving of a high optical level packet, the multiplication factor of the APD 11 falls because of the receiving of the high optical level packet. The multiplication factor of the APD 11 fluctuates until the multiplication factor of the APD 11 returns to a predetermined value. The time constant circuit 23b controls a time constant. In this case, the time constant circuit 23b generates a bias voltage compensation signal by converting the waveform of the total signal to a waveform which exhibits a characteristic reverse to the multiplication factor fluctuation characteristic of the APD 11.

The compensation pulse signal generation section 22-1 stores in advance data by which each monitored value is associated with an amplitude value. However, a signal obtained by multiplying (AND) the monitor signal the falling of which is inclined and a reset pulse supplied from an upper system together may be used as a compensation pulse signal. In addition, a signal detection pulse or a clock slip pulse may be used in place of a reset pulse.

An optical receiver according to a fifth embodiment will now be described. The fundamental structure of an optical receiver according to a fifth embodiment is similar to that of the optical receiver 1-4 according to the fourth embodiment. An optical receiver according to a fifth embodiment differs from the optical receiver 1-4 according to the fourth embodiment in that the multiplication factor of an APD 11 is compensated by controlling the gain of an amplification section 14 arranged behind the APD 11.

Figure 32:
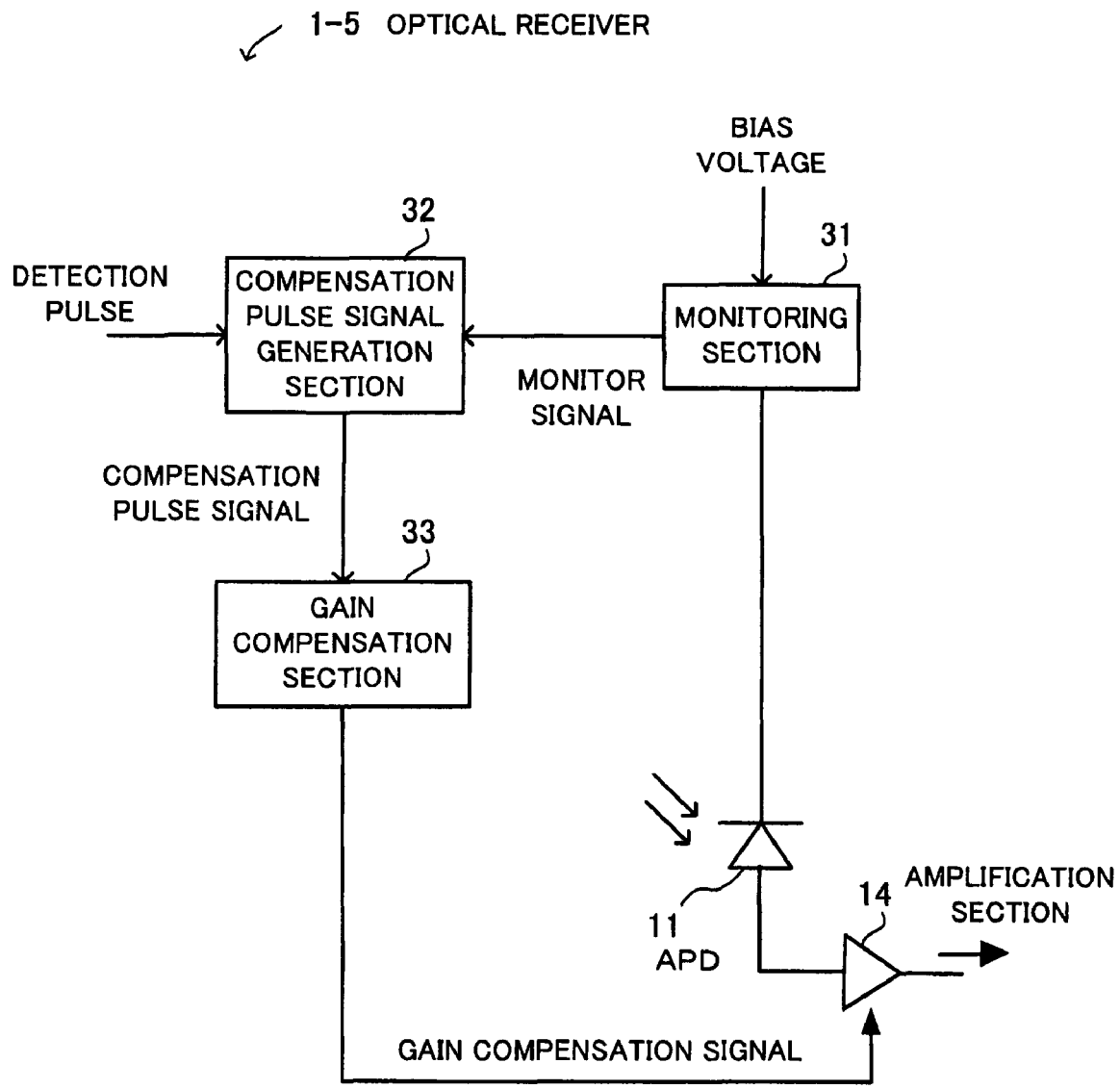
FIG. 32 illustrates the structure of an optical receiver according to a fifth embodiment.

FIG. 32 illustrates the structure of an optical receiver according to a fifth embodiment. An optical receiver 1-5 comprises the APD 11, the amplification section 14, a monitoring section 31, a compensation pulse signal generation section 32, and a gain compensation section 33 and receives optical packets burst-transmitted.

The monitoring section 31 monitors the input level of each optical packet or an electrical signal to which each optical packet is converted by the APD 11. The compensation pulse signal generation section 32 generates a compensation pulse signal on the basis of a monitor signal with a detection pulse indicative of the detection of the optical packet as a trigger. The gain compensation section 33 controls the time constant of the compensation pulse signal, generates a gain compensation signal for compensating the gain of the amplification section 14, and transmits the gain compensation signal to the amplification section 14.

If a low optical level packet is received just after receiving of a high optical level packet, the multiplication factor of the APD 11 falls because of the receiving of the high optical level packet. The gain compensation section 33 increases the gain of the amplification section 14 for multiplication factor return time it takes the multiplication factor of the APD 11 to return to a predetermined value. By doing so, the gain compensation section 33 compensates for a fall in the multiplication factor of the APD 11 which occurs at the time of the low optical level packet being received.

Figure 33:
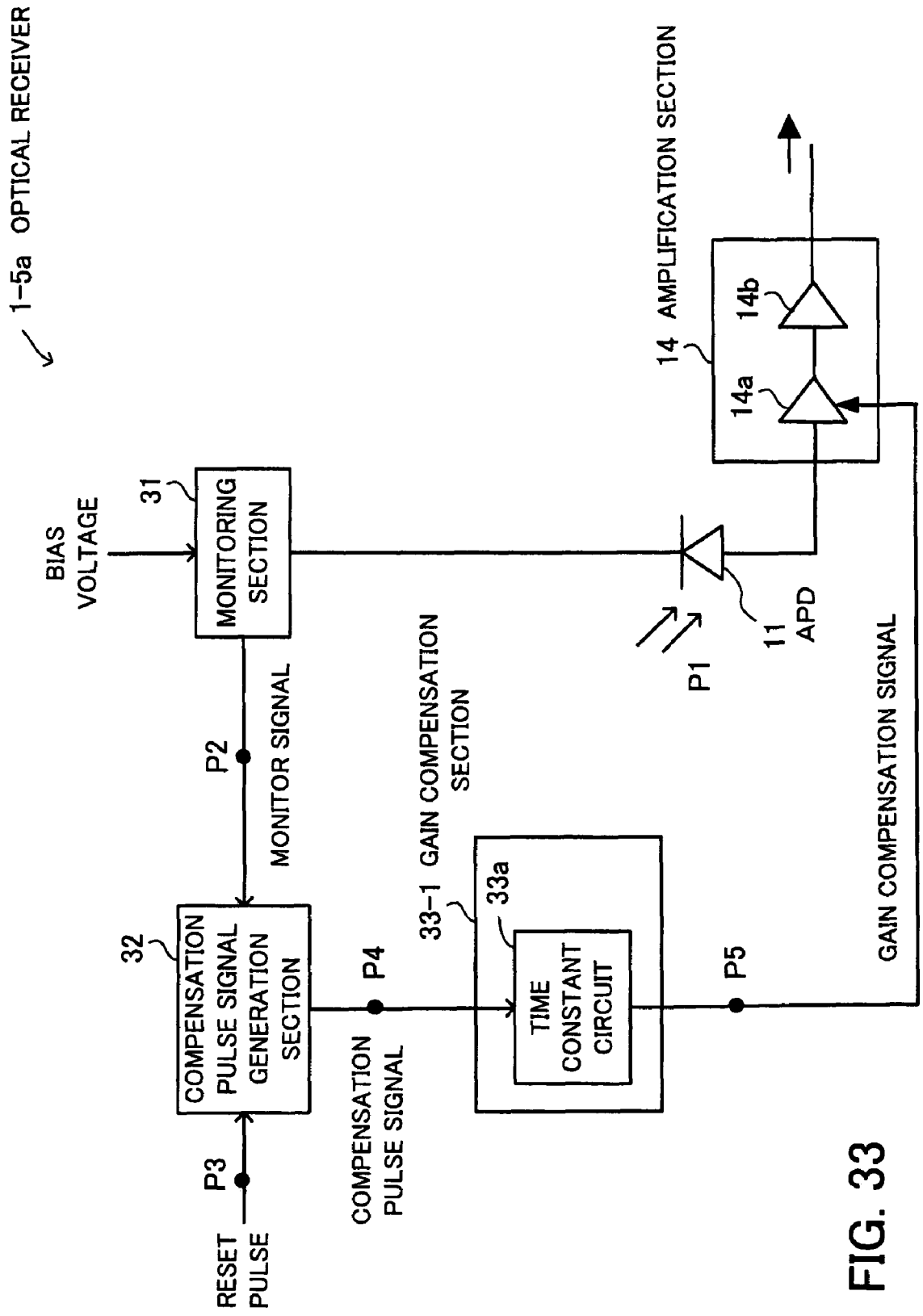
FIG. 33 illustrates a first example of the structure of the optical receiver.
Figure 34:
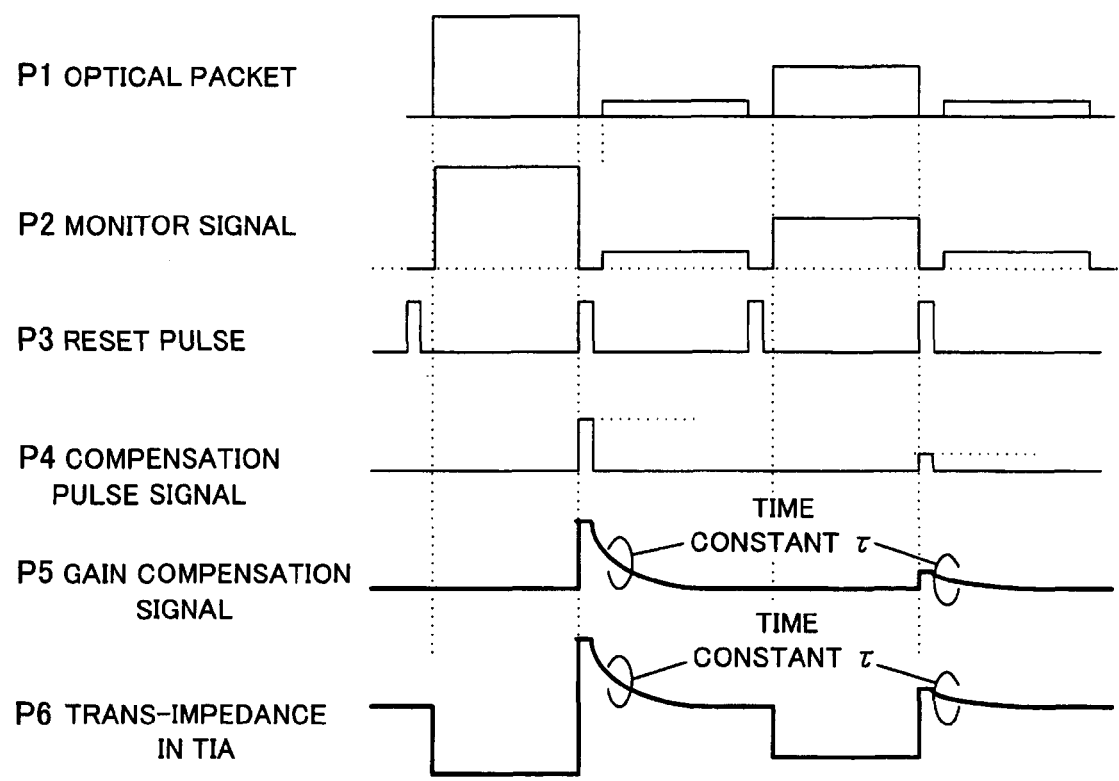
FIG. 34 is a time chart of each waveform in an optical receiver taken as the first example of the structure of the optical receiver.

A first example of the structure of the optical receiver 1-5 will now be described. FIG. 33 illustrates a first example of the structure of the optical receiver 1-5. FIG. 34 is a time chart of each waveform in an optical receiver taken as the first example of the structure of the optical receiver 1-5. An optical receiver 1-5a comprises an APD 11, an amplification section 14 (including a preamplifier 14a and a main amplifier 14b), a monitoring section 31, a compensation pulse signal generation section 32, and a gain compensation section 33-1. The gain compensation section 33-1 includes a time constant circuit 33a. A trans-impedance amplifier (TIA), for example, is used as the preamplifier 14a.

If optical packets burst-transmitted are inputted as indicated by P1 of FIG. 34, the monitoring section 31 detects the input level of each optical packet (P2). The compensation pulse signal generation section 32 determines the amplitude of compensation voltage for bias voltage applied to the APD 11 according to a monitored value on the basis of data which is stored in advance and by which each monitored value is associated with an amplitude value. Then the compensation pulse signal generation section 32 generates and outputs a compensation pulse signal (P4) with a reset pulse (P3) which is supplied from a system as a trigger.

If a low optical level packet is received just after receiving of a high optical level packet, the multiplication factor of the APD 11 falls because of the receiving of the high optical level packet. The multiplication factor of the APD 11 fluctuates until the multiplication factor of the APD 11 returns to a predetermined value. The time constant circuit 33a controls a time constant. In this case, the time constant circuit 33a generates a gain compensation signal by converting the waveform of the compensation pulse signal to a waveform which exhibits a characteristic reverse to the multiplication factor fluctuation characteristic of the APD 11.

That is to say, the compensation pulse signal passes through the time constant circuit 33a. By doing so, the compensation pulse signal exhibits a characteristic reverse to the transient response characteristic of fluctuation in the multiplication factor of the APD 11. As a result, a gain compensation signal (P5) for compensating fluctuations in the multiplication factor of the APD 11 is generated and is transmitted to the preamplifier 14a. The gain of the preamplifier 14a is increased (P6) by the gain compensation signal for a period of time during which the multiplication factor of the APD 11 fluctuates, so the multiplication factor of the APD 11 is compensated.

Figure 35:
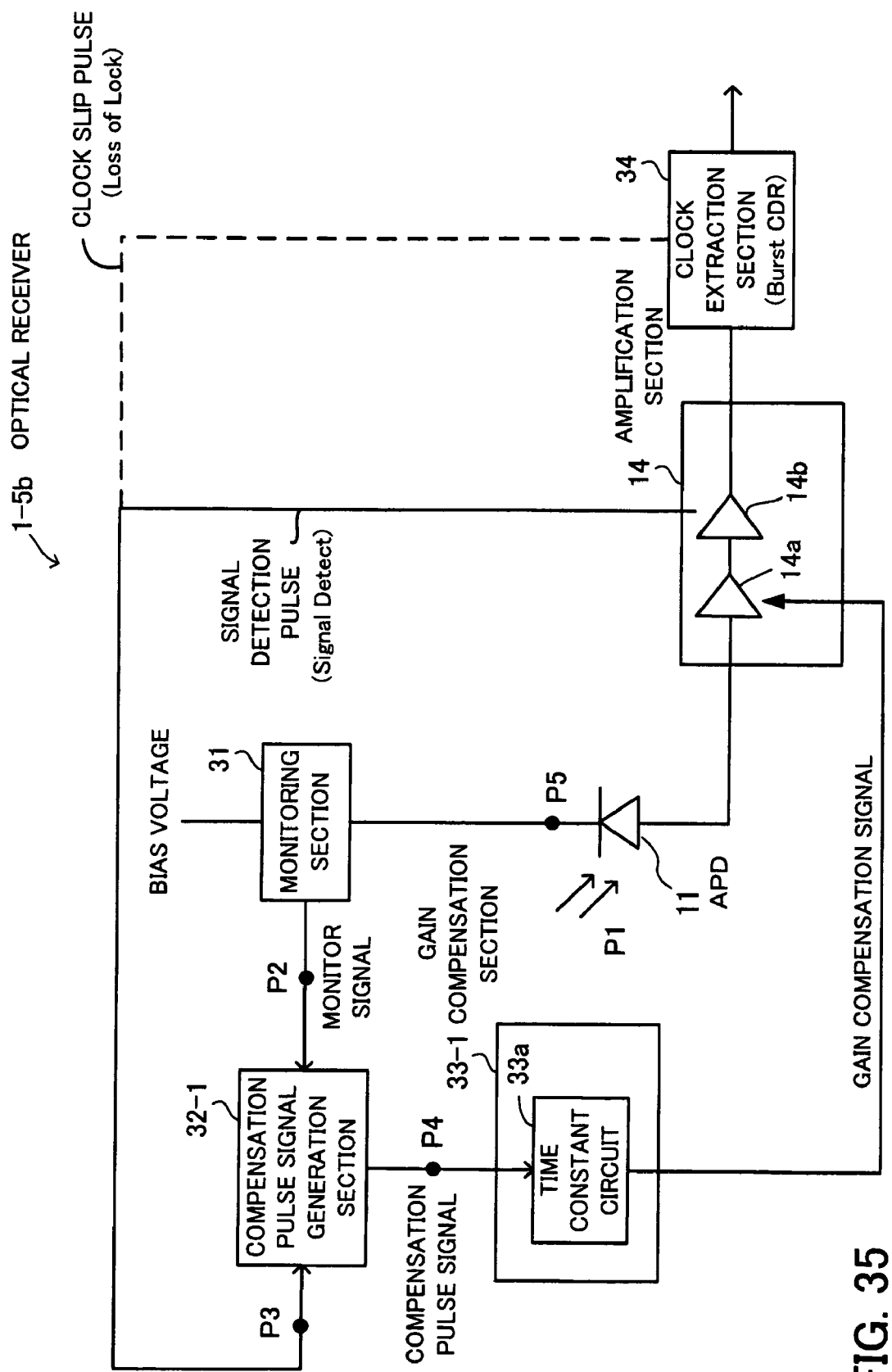
FIG. 35 illustrates a second example of the structure of the optical receiver.
Figure 36:
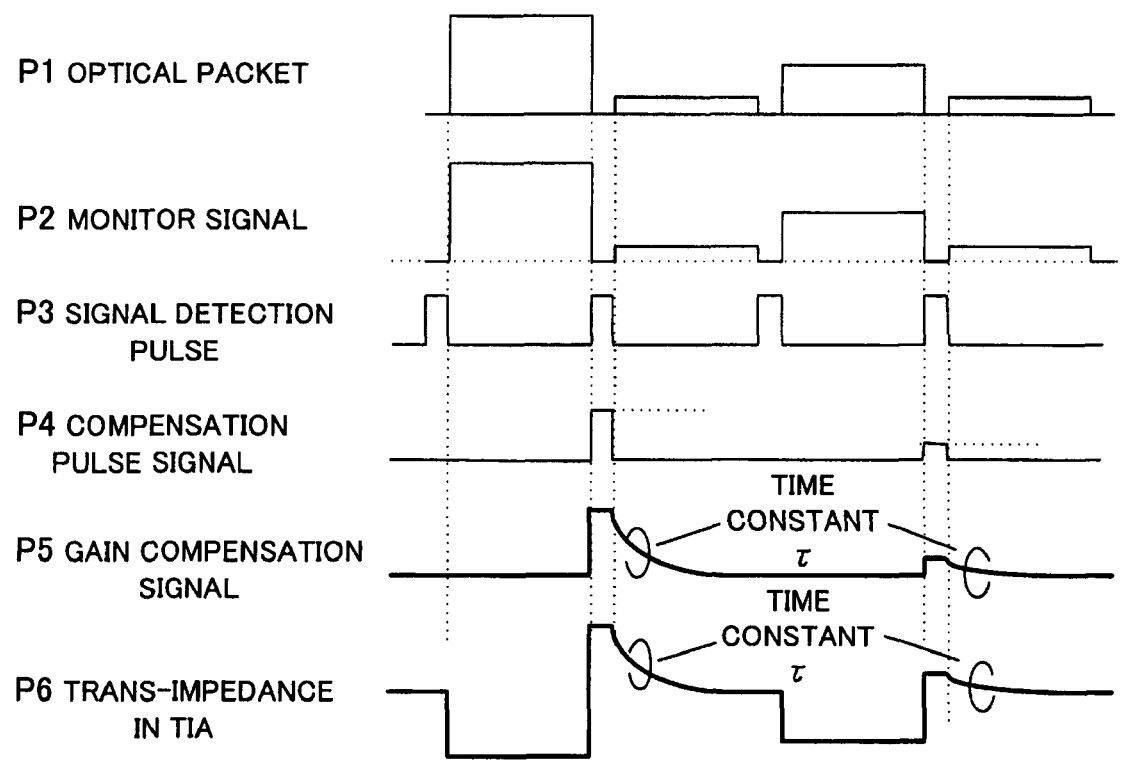
FIG. 36 is a time chart of each waveform in an optical receiver taken as the second example of the structure of the optical receiver.

A second example of the structure of the optical receiver 1-5 will now be described. FIG. 35 illustrates a second example of the structure of the optical receiver 1-5. FIG. 36 is a time chart of each waveform in an optical receiver taken as the second example of the structure of the optical receiver 1-5. An optical receiver 1-5b comprises an APD 11, an amplification section 14 (including a preamplifier 14a and a main amplifier 14b), a monitoring section 31, a compensation pulse signal generation section 32-1, a gain compensation section 33-1, and a clock extraction section 34. The gain compensation section 33-1 includes a time constant circuit 33a. The clock extraction section 34 is a clock data recovery (CDR) which extracts a clock used for performing a data reproduction process from a signal outputted from the main amplifier 14b.

If optical packets burst-transmitted are inputted as indicated by P1 of FIG. 36, the monitoring section 31 detects the input level of each optical packet (P2). The compensation pulse signal generation section 32-1 determines the amplitude of compensation voltage for bias voltage applied to the APD 11 according to a monitored value on the basis of data which is stored in advance and by which each monitored value is associated with an amplitude value. Then the compensation pulse signal generation section 32-1 generates and outputs a compensation pulse signal (P4) with a signal detection pulse (signal detect (P3)) which is generated by the main amplifier 14b as a trigger.

If a low optical level packet is received just after receiving of a high optical level packet, the multiplication factor of the APD 11 falls because of the receiving of the high optical level packet. The multiplication factor of the APD 11 fluctuates until the multiplication factor of the APD 11 returns to a predetermined value. The time constant circuit 33a controls a time constant. In this case, the time constant circuit 33a generates a gain compensation signal by converting the waveform of the compensation pulse signal to a waveform which exhibits a characteristic reverse to the multiplication factor fluctuation characteristic of the APD 11.

That is to say, the compensation pulse signal passes through the time constant circuit 33a. By doing so, the compensation pulse signal exhibits a characteristic reverse to the transient response characteristic of fluctuation in the multiplication factor of the APD 11. As a result, a gain compensation signal (P5) for compensating fluctuations in the multiplication factor of the APD 11 is generated and is transmitted to the preamplifier 14a. The gain of the preamplifier 14a is increased (P6) by the gain compensation signal for a period of time during which the multiplication factor of the APD 11 fluctuates, so the multiplication factor of the APD 11 is compensated.

A clock slip pulse (loss of lock) outputted from the clock extraction section 34 may be used as a detection pulse in place of a signal detection pulse (signal detect).

Applications of the above optical receivers will now be described. With the optical receiver 1-4 according to the fourth embodiment depicted in FIG. 21, when the compensation pulse signal generation section 22 recognizes from a monitor signal that an excessively high optical level packet is inputted, the compensation pulse signal generation section 22 may output a shutdown signal for shutting down the bias voltage compensation section 23. This prevents an APD element from breaking at the time of an excessively high optical level signal being inputted.

This is the same with the optical receiver 1-5 according to the fifth embodiment depicted in FIG. 32. That is to say, when the compensation pulse signal generation section 32 recognizes from a monitor signal that an excessively high optical level packet is inputted, the compensation pulse signal generation section 32 can output a shutdown signal for shutting down the gain compensation section 33.

Figure 37:
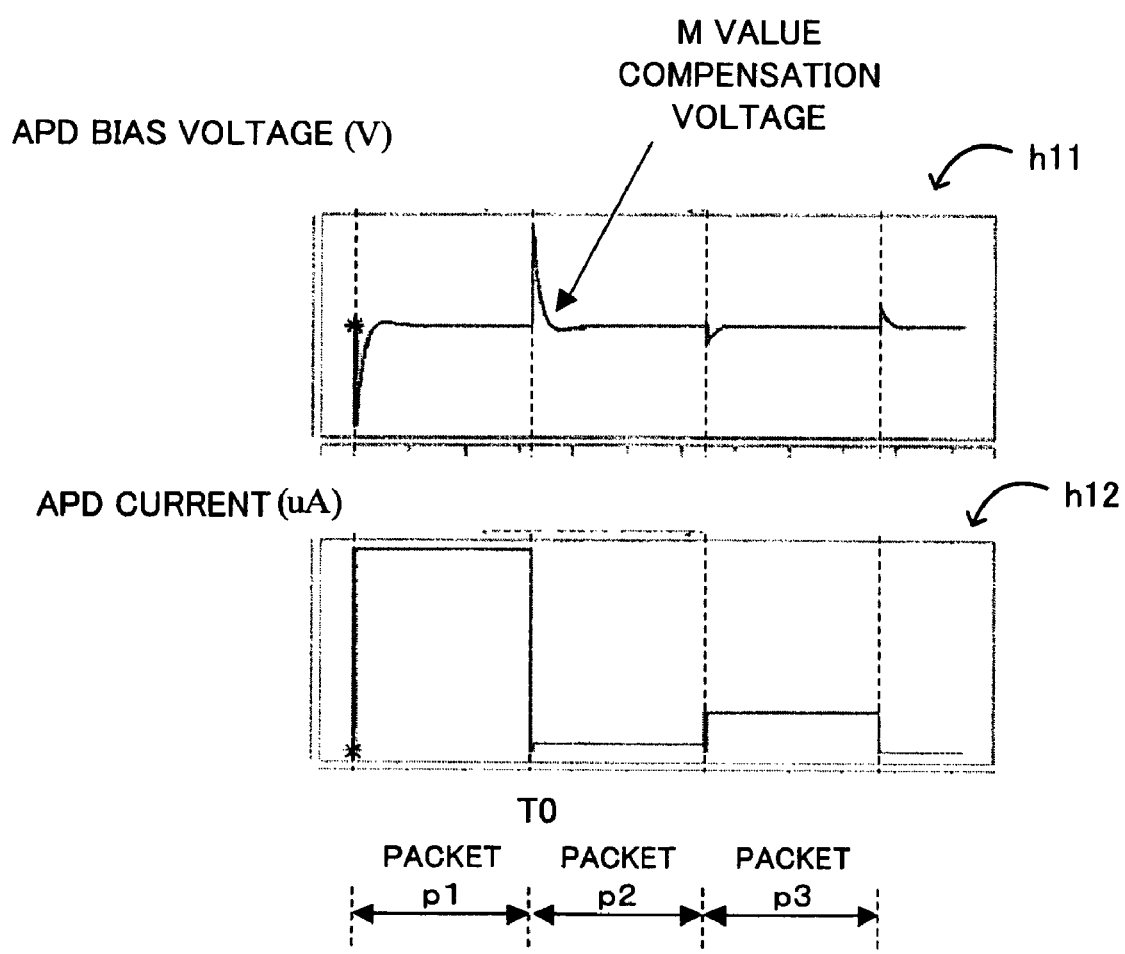
FIG. 37 illustrates simulation results.
Figure 38:
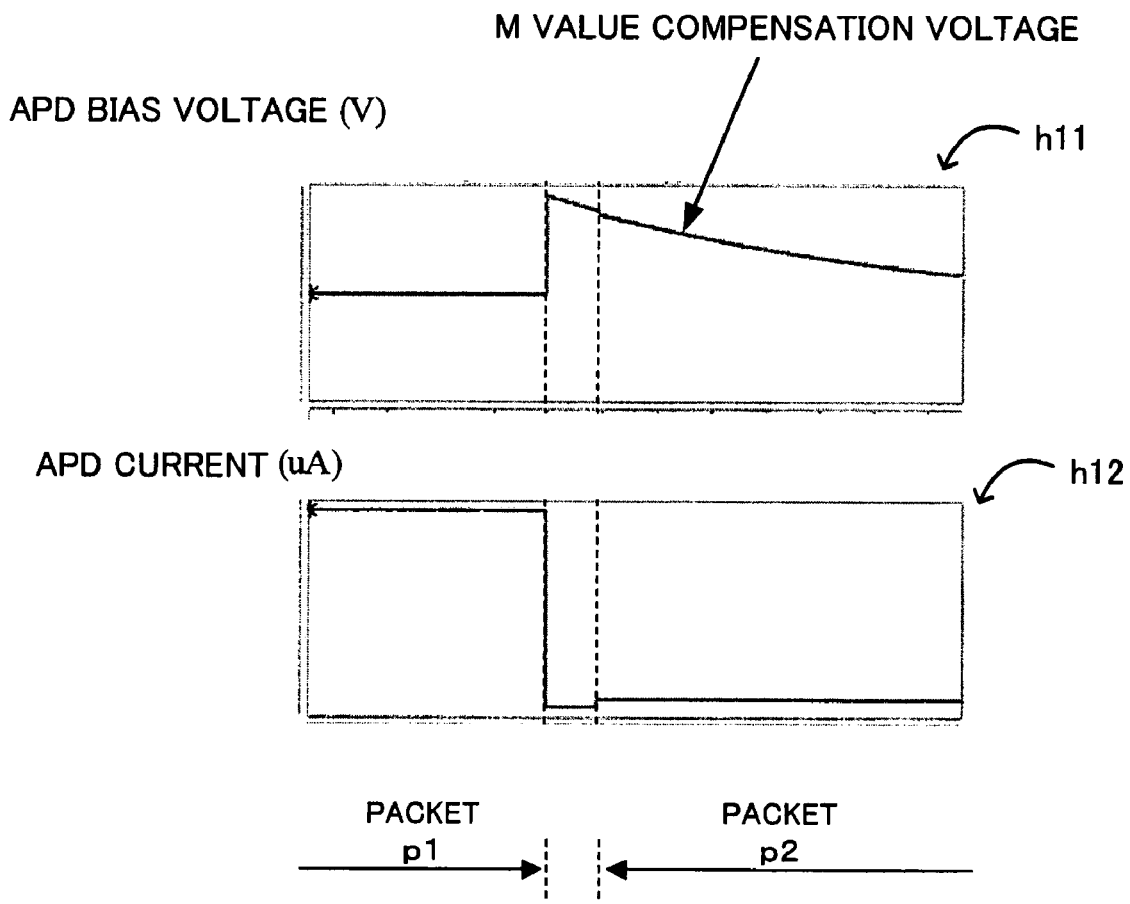
FIG. 38 illustrates simulation results.
Figure 39:
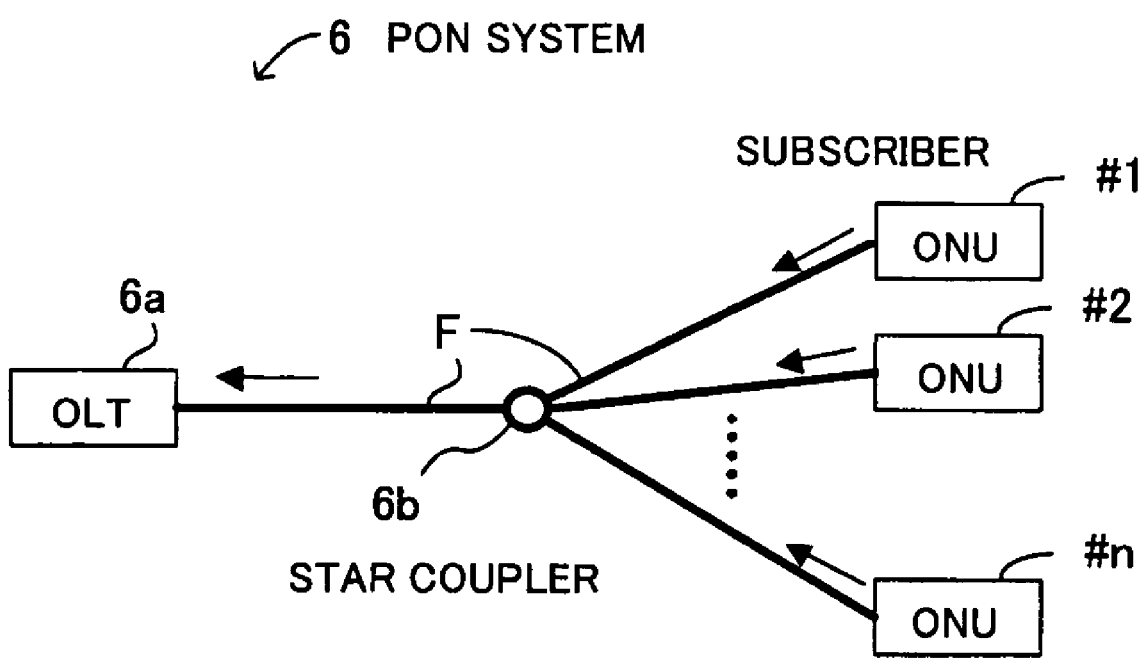
FIG. 39 illustrates the structure of a PON system.
Figure 40:
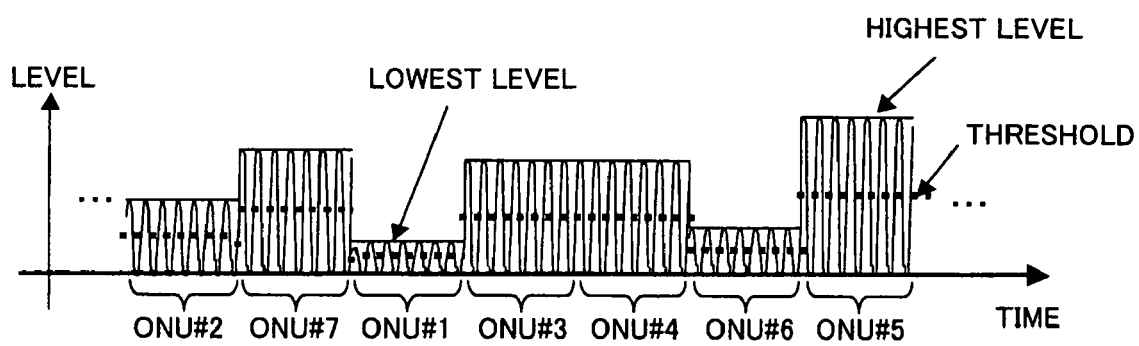
FIG. 40 illustrates the level of signals received by an OLT.
Figure 41:
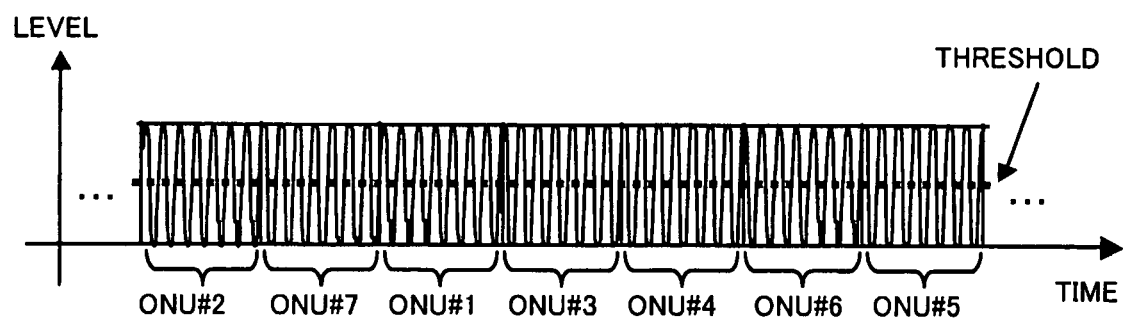
FIG. 41 illustrates a signal level kept at a constant value by exercising control.

Simulation results will now be described. FIGS. 37 and 38 illustrate simulation results. FIGS. 37 and 38 illustrate simulation results obtained by the use of the optical receiver 1-2 according to the second embodiment. With a waveform h11, a horizontal axis indicates time and a vertical axis indicates bias voltage. With a waveform h12, a horizontal axis indicates time and a vertical axis indicates APD current. FIG. 38 is an enlarged view of FIG. 37 at T0.

Bias voltage applied to an APD is temporarily increased just after a high optical level packet is received. The simulation results also show that just after a high optical level packet is received, bias voltage applied to an APD is increased and that a fall in the M value of the APD is curbed. Therefore, receiving sensitivity to an optical packet just after receiving of a high optical level packet can be improved.

The optical receiver according to the present invention comprises the light receiving element, the bias voltage supply section which supplies bias voltage to the light receiving element, and the monitoring section which monitors an input level of an optical packet signal or an electrical signal and which transmits a monitored value to the bias voltage supply section. The bias voltage supply section temporarily increases the bias voltage according to magnitude of the monitored value after an end of receiving of the optical packet signal. As a result, a deterioration in receiving sensitivity to a low optical level packet signal received after receiving of a high optical level packet signal can be improved in the process of receiving optical packet signals. Accordingly, communication quality can be improved.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention has (have) been described in detail, it should be understood that various changes, substitutions and alterations could be made hereto without departing from the spirit and scope of the invention.

What is claimed is:

1. An optical receiver for receiving optical packet signals transmitted in burst mode, the optical receiver comprising:
   a light receiving element which receives the optical packet signals and converts the optical packet signals to electrical signals;
   a bias voltage supply section which supplies bias voltage to the light receiving element; and
   an inductor which temporarily increases the bias voltage, when a low optical level packet signal is received after a high optical level packet signal, by generating induced electromotive force for an interval taken to return a multiplication factor of the light receiving element because of a decrease in an amount of electrical signal current.

2. The optical receiver according to claim 1, further comprising a time constant control circuit which is positioned in proximity to the inductor and changes a waveform of the bias voltage to which the induced electromotive force is added by controlling a time constant in order to increase, when the low optical level packet signal is received after the high optical level packet signal, the bias voltage for a time it takes the multiplication factor of the light receiving element, which falls because of receiving the high optical level packet signal, to return to a predetermined value.

* * * * *